US010764028B2

(12) United States Patent
Brown et al.

(10) Patent No.: US 10,764,028 B2
(45) Date of Patent: Sep. 1, 2020

(54) CLOCK TRANSFER AND FILTERING USING DIGITAL CLOCK PHASE INFORMATION

(71) Applicant: MACOM Technology Solutions Holdings, Inc., Lowell, MA (US)

(72) Inventors: Matthew Brown, Santa Clara, CA (US); Benjamin Brown, Santa Clara, CA (US)

(73) Assignee: MACOM Technology Solutions Holdings, Inc., Lowel, MA (US)

( * ) Notice: Subject to any disclaimer, the term of this patent is extended or adjusted under 35 U.S.C. 154(b) by 0 days.

(21) Appl. No.: 16/459,701

(22) Filed: Jul. 2, 2019

(65) Prior Publication Data

US 2020/0028662 A1   Jan. 23, 2020

Related U.S. Application Data

(60) Provisional application No. 62/700,938, filed on Jul. 20, 2018.

(51) Int. Cl.
| | |
|---|---|
| *H04L 7/033* | (2006.01) |
| *H03L 7/14* | (2006.01) |
| *H03L 7/07* | (2006.01) |
| *H03L 7/093* | (2006.01) |

(52) U.S. Cl.
CPC .............. *H04L 7/0331* (2013.01); *H03L 7/07* (2013.01); *H03L 7/093* (2013.01); *H03L 7/14* (2013.01)

(58) Field of Classification Search
CPC ... H04L 7/0331; H04L 7/0091; H04L 7/0025; H03L 7/14; H03L 7/07; H03L 7/093

USPC .................................................. 375/376, 294
See application file for complete search history.

(56) References Cited

U.S. PATENT DOCUMENTS

| | | | |
|---|---|---|---|
| 6,704,382 B1 | 3/2004 | Metzler et al. | |
| 8,901,975 B2 | 12/2014 | Navid | |
| 8,964,925 B1* | 2/2015 | Saed ..................... | H03L 7/0807 375/294 |
| 2006/0294442 A1 | 12/2006 | Kanter et al. | |
| 2011/0075781 A1* | 3/2011 | Kenney .................. | H03L 7/235 375/376 |

* cited by examiner

*Primary Examiner* — Fitwi Y Hailegiorgis
(74) *Attorney, Agent, or Firm* — Amin, Turocy & Watson, LLP

(57) ABSTRACT

A digital PLL, which can be a virtual PLL, can condition digital phase information, comprising phase modification requests, for transfer, jitter, and phase-noise filtering of clock information between a clock recovery unit and a clock generation unit associated with phase interpolators. The digital PLL can employ a set of accumulators, proportional and integral filter component, generator component, feedback path between the output and input of the digital PLL, and other digital signal processing components. The proportional and integral filter component can be configurable to set a loop damping factor and a loop bandwidth of the filter, based on respective parameters. Based on the filter output, the generator component can generate output phase information, comprising phase modification requests, that can be transmitted to another phase interpolator(s) associated with a transmitter or other component(s) of the device to facilitate generating a clock for the transmitter or other component(s).

20 Claims, 17 Drawing Sheets

CLOCK TRANSFER AND FILTERING USING DIGITAL CLOCK PHASE INFORMATION

CROSS-REFERENCE TO RELATED APPLICATION

This application claims priority to U.S. Provisional Patent Application No. 62/700,938, filed Jul. 20, 2018, and entitled "CLOCK TRANSFER AND FILTERING USING DIGITAL CLOCK PHASE INFORMATION," the entirety of which is hereby incorporated herein by reference.

TECHNICAL FIELD

The subject disclosure relates generally to electronic circuitry, e.g., to clock transfer and filtering using digital clock phase information.

BACKGROUND

In a typical digital communication device, in order to detect data in a received signal, a receiver can recover a clock from the received signal. Using the recovered clock, the device can detect and recover the data from the received signal. Often that recovered clock, which can be a high-speed clock, can be used as a reference for a transmitter on the same device. However, there can be various challenges or problems that can arise in attempting to transfer a high-speed clock across the device (e.g., from the receiver to the transmitter).

The above-described description is merely intended to provide a contextual overview relating to current technology and is not intended to be exhaustive.

SUMMARY

The following presents a simplified summary in order to provide a basic understanding of some aspects described herein. This summary is not an extensive overview of the disclosed subject matter. It is intended to neither identify key or critical elements of the disclosure nor delineate the scope thereof. Its sole purpose is to present some concepts in a simplified form as a prelude to the more detailed description that is presented later.

In some embodiments, the disclosed subject matter can comprise a system for transferring phase information. The system can comprise a digital phase-locked loop component configured to receive input phase information from a clock recovery component that is associated with a first phase interpolator, generate output phase information based at least in part on the input phase information and a filter of the digital phase-locked loop component that is applied to the input phase information, and transmit the output phase information to a second phase interpolator, wherein the digital phase-locked loop component is configured to control the filter based at least in part on a parameter that facilitates defining a filter function of the filter. The system also can comprise a generator component configured to generate a phase modification request based at least in part on a frequency offset generated by the filter, wherein the output phase information comprises the phase modification request.

In certain embodiments, the disclosed subject matter can comprise a method that can include controlling, by a digital phase-locked loop, a filter based at least in part on a parameter that facilitates determining a filter function of the filter. The method also can comprise generating, by the digital phase-locked loop, output phase data based at least in part on the filter that is applied to input phase data received from a clock recovery circuit that is associated with a first phase interpolator. The method further can comprise transmitting, by the digital phase-locked loop, the output phase data to a second phase interpolator to facilitate generating clock data of a clock to be applied to a transmitter or other component of a device, wherein the output phase data comprises a phase modification request determined based at least in part on a frequency offset produced by the filter.

In still other embodiments, the disclosed subject matter can comprise a device that can include a digital phase-locked loop component configured to receive an input phase signal from a clock and data recovery unit that is associated with a first phase interpolator, generate an output phase signal based at least in part on a filter of the digital phase-locked loop component that is applied to accumulated input phase signals, and transmit the output phase signal to a second phase interpolator, wherein the digital phase-locked loop component is configured to control the filter based at least in part on a parameter that facilitates defining a filter function of the filter, and wherein inputs to the filter comprise the accumulated input phase signals that are based at least in part on an accumulation of input phase signals, including the input phase signal, from the first phase interpolator and an accumulation of output phase signals, including the output phase signal, received from a feedback path of the digital phase-locked loop component. The device also can comprise a generator component configured to generate a phase modification request based at least in part on a frequency offset signal produced by the filter, wherein the output phase signal comprises the phase modification request.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

Figure 1:
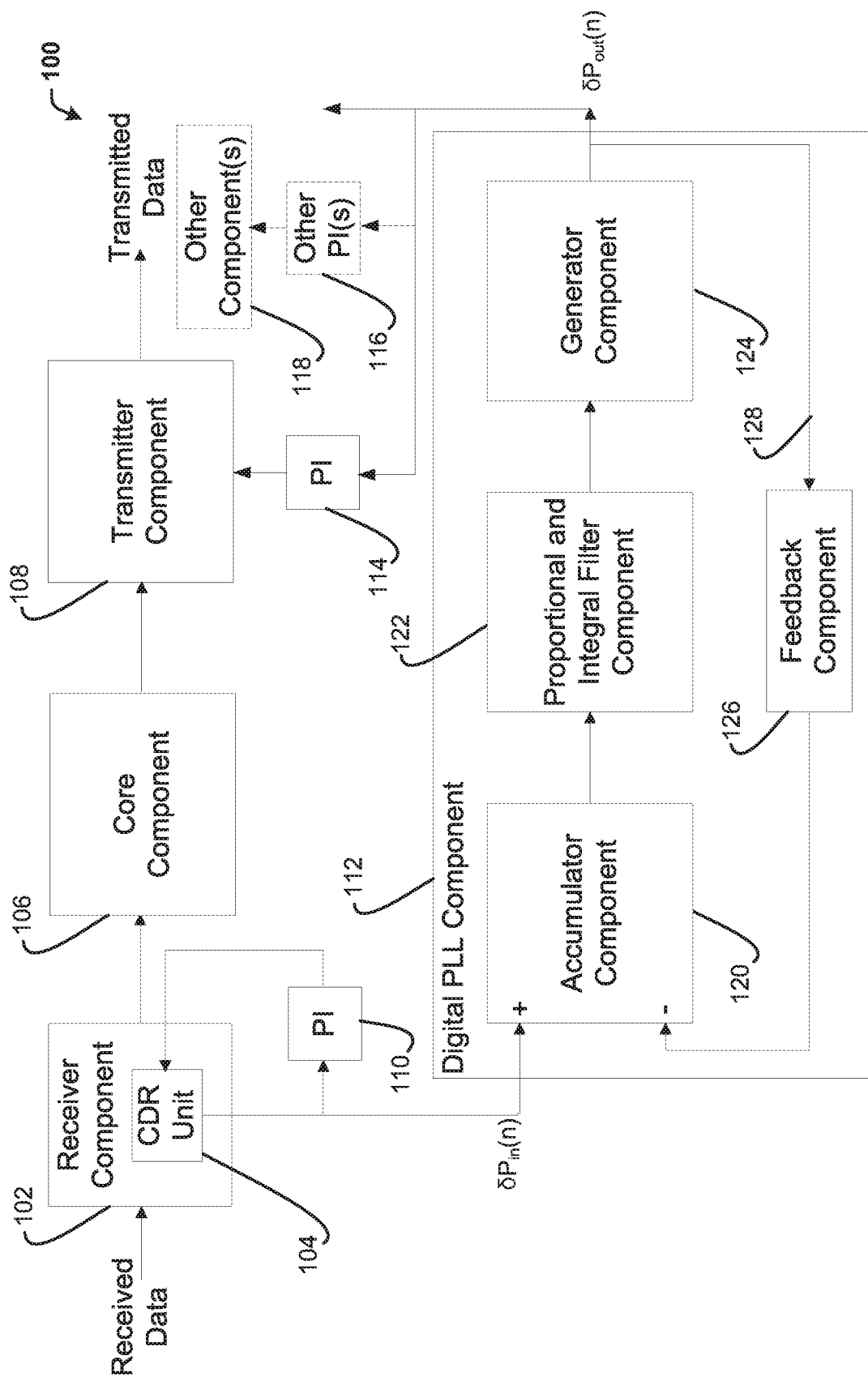
FIG. 1 illustrates a block diagram of a non-limiting example system that can employ a digital or virtual phase-locked loop (digital or virtual PLL) component to filter phase information (e.g., input phase information) for clock signals of a device, in accordance with various aspects and embodiments of the disclosed subject matter.

The disclosure herein is described with reference to the drawings, wherein like reference numerals are used to refer to like elements throughout. In the following description, for purposes of explanation, numerous specific details are set forth in order to provide a thorough understanding of the disclosed subject matter. It may be evident, however, that various disclosed aspects can be practiced without these specific details. In other instances, well-known structures and devices are shown in block diagram form in order to facilitate describing the disclosed subject matter.

In a typical digital communication device, in order to detect data in a received signal, a receiver can recover a clock from the received signal. Using the recovered clock, the device can detect and recover the data from the received signal. Often that recovered clock can be used as a reference for a transmitter on the same device. For instance, a clock can be transferred as a reference from the clock and data recovery (CDR) unit on one side of a chip to a driver unit on the other side of the chip. Conventionally, transferring a high-speed clock across a device can be accomplished by routing a clock signal either on the die or over the printed circuit board (PCB) underneath the die, and filtering and scaling (e.g., increasing or decreasing) frequency using a phase-locked loop (PLL). However, there can be various challenges or problems that can arise in attempting to transfer a high-speed clock (e.g., the recovered clock) across the device (e.g., from the receiver to the transmitter or other device component).

For instance, using certain traditional techniques, transferring a high-speed clock across the device can consume a significant amount of power and a significant amount of area, and further, along the way the clock can be worsened by noise (e.g., phase noise) along the path. It often can be desirable to reduce the phase noise in the recovered clock. Conventionally, to achieve such reduction in the phase noise in the recovered clock, an intermediate phase-locked loop (PLL) with a low-frequency, low-pass filter response can be used to reduce the phase noise in the clock. However, such a PLL can consume an undesirably large amount of power and area.

Also, such conventional approaches for transferring a high-speed clock from the CDR unit across a device often can utilize an undesirably large amount of power due to the line drivers and the extra PLL. It can become more costly on large multi-lane chips where many clocks often can be transferred and, in many cases, can be cross-connected to different output lanes.

Such conventional approaches can be further complicated since the jitter at the input of the CDR unit can be undesirably high (e.g., very high) as allowed by various interface standards, while on the transmitter, it can be desirable to have the output jitter be relatively small, and any contribution of jitter from the recovered clock can make it relatively difficult to meet the transmitter jitter specifications that can be desired (e.g., required) by the various interface standards. The PLL at the transmitter typically does not have low enough bandwidth to filter out the jitter sufficiently. The additional intermediate PLL can be utilized to filter out the jitter using a significantly lower (e.g., much lower) bandwidth. This can further increase the amount of die area and the amount of power used for the transfer of the recovered clock to the transmitter. A filter frequency potentially as low as 300 kilohertz (kHz), for example, may be desired (e.g., required). In other examples or applications, a filter frequency higher than 300 kHz or lower than 300 kHz may be desired (e.g., required).

A technique can be employed to generate a variable-frequency clock which can use a fixed-frequency clock as a starting point where the phase can be shifted by a predictable amount on a scheduled basis. For instance, the phase can be shifted once per 6 nanoseconds (ns) by $\frac{1}{32}$ unit intervals (UI). This, in effect, can cause the clock phase to be accelerated by $\frac{1}{32}$ UI/6 ns=5.2 MHz. If the fixed clock that is being modified has a typical frequency of 26.5625 GHz, the resulting fractional frequency shift can be 5.2 MHz/26.5625 GHz=196 parts per million (ppm).

Such a technique can be used for the recovered clock generation in a CDR unit or as a transmitter clock. If the clock source is the same architecture and uses the exact same reference clock in both the receiver and in the transmitter, incrementing or decrementing the phase in the transmitter exactly as done at the receiver can result in the transmitter clock precisely mimicking the recovered clock in the receiver.

In order for this technique to work in a desirable (e.g., acceptable) manner, this technique can benefit from the ability to send an increment or decrement request at a sufficient rate desired (e.g., acceptable or necessary) to cause the desired (e.g., acceptable or required) offset frequency. For the example above, it can be desirable (e.g., acceptable or required) to send a request at least once every 6 ns, which can desirably (e.g., acceptably or optimally) utilize sending of requests at a rate of 166 megahertz (MHz). In another example, an increment or decrement request can be sent at double the once every 6 ns rate to allow for 400 ppm offset in frequency, so the request rate can be at least 333.3 MHz. If the core system clock is at least double this, it can be relatively easy to transport this through without sending multiple instances per transfer (e.g., sending the requests serially). However, some cases can benefit from an update higher than the core system clock supports. For these cases, multiple requests can be accumulated over a defined period and can be transported as a single value. The accumulation of the requests effectively can provide some further filtering.

The updates can be sent through a device core which can have a system clock that can be asynchronous with the recovered clocks. The transfer technique can take this into account. It is also possible, due to various processes such as noise, jitter, and detection uncertainty, that requests can occur in clumps and possibly in sequences of increments and decrements. These can be smoothed out and/or tolerated as well.

In accordance with various embodiments, the disclosed subject matter can employ a digital or virtual PLL which can be used for transfer of phase information associated with a phase interpolator (e.g., phase information received by the phase interpolator from a CDR unit) used in a clock recovery loop to another identical phase interpolator used to generate a clock at another location such as a transmitter. The digital PLL can be implemented using digital signal processing techniques and digital functions to reduce jitter, phase noise, and/or other noise on the generated clock. For instance, the digital PLL can filter jitter in the clock-related information (e.g., phase information) such that jitter in the recovered clock does not result in non-compliant jitter at the transmitter or other component(s) of the device (e.g., the digital PLL can filter the jitter in the clock-related information such that it complies with applicable transmitter jitter specifications, which can be desired by various interface standards). The digital PLL also can desirably smooth out requests (e.g., phase modification requests), for example, with regard to requests that can occur in clumps and/or in sequences of increments and decrements, such that a regular phase update can occur. The digital PLL can be designed such that it emulates the behavior of a conventional analog PLL including desirable low-pass phase noise filtering and transient response. For instance, the digital PLL (e.g., virtual PLL) can perform desirable filtering (e.g., phase interpolator filtering) and control of clock-related information based at least in part on an analog PLL model. By emulating a real (e.g., analog) PLL, mathematical techniques for analyzing and predicting conventional PLL behavior can be applied. The disclosed subject matter can tune behavior of the digital PLL predictably using configurable parameters. For example, a digital PLL can be configured or tuned to have a 300 kHz low-pass response and a damping factor of 4, wherein such digital PLL, as configured or tuned, can eliminate phase noise above 300 kHz and respond quickly to start-up and steps in phase, but can have minimal phase noise peaking at frequencies below the low-pass corner frequency.

The use of the digital PLL of the disclosed subject matter can provide a number of useful features that are not found or possible using more rudimentary techniques. Two non-limiting, example characteristics of the digital PLL of the disclosed subject matter can be (1) the ability to filter the jitter on the input phase information in a predictable, familiar way and (2) to generate phase information at the output in a regular fashion based at least in part on a long-term history from the phase information at the input.

The disclosed subject matter can generate variable-frequency clocks by stepping the phase at a fixed frequency using a function called a phase interpolator. To cause a step change in phase, the current phase value can be either incremented or decremented by a fixed phase step. If phase steps are requested on a regular schedule, a frequency offset can be created. A variable frequency source using this technique can be used by either the clock recovery function in a receiver or clock generation in the transmitter. If the same phase interpolator design is used in both the receiver and transmitter and the same fixed-frequency clock is used for both the receiver and transmitter, a clock can be generated by or for the transmitter by using the phase interpolator phase steps associated with the phase interpolator in the receiver. In this way, the clock can effectively be transferred efficiently through the device by transferring digital information (e.g., phase steps) rather than transferring an actual clock across the device. This not only can save a great deal of area and power with respect to the device, but also can make it very convenient to selectively route the clock information to different or multiple places (e.g., different or multiple components in different places) on the device. The disclosed subject matter can provide a means to transfer clock information (e.g., digital clock information) across the device as digital data and can furthermore provide desirably good phase-noise mitigation while using significantly lower power and area than conventional PLLs using conventional techniques.

In some embodiments, the digital PLL can determine (e.g., calculate) a phase difference (e.g., an accumulated phase difference) based at least in part on the input phase information (e.g., input phase modification requests) and output phase information (e.g., output phase modification requests, wherein the input phase information can be received by the digital PLL from a CDR unit (e.g., CDR unit of a receiver), wherein the CDR unit also can be associated with a first phase interpolator, and wherein the output phase information (or a scaled version of the output phase information) can be received by the digital PLL from the output of the digital PLL via a feedback path. The digital PLL can accumulate the input phase information and the output phase information and can determine the phase difference based at least in part on the difference in the accumulated input phase information and output phase information. The input phase information can comprise an increment request, a decrement request, or a no change request or signal received from the first phase interpolator associated with the receiver, wherein the input phase information can be selected or received from any of one or more receivers of the device. The output phase information can comprise an increment request, a decrement request, or a no change request or signal received via the feedback path of the digital PLL, wherein the output phase information also is communicated to a second phase interpolator of a transmitter and/or another phase interpolator(s) associated with another component(s) of the device.

In other embodiments, the digital PLL can sum a configurable phase step value after the phase difference accumulator for skew and/or delay adjustment, step response testing, phase modulation using a test pattern (e.g., sine wave pattern, square wave pattern), and/or other desired uses.

In certain embodiments, the disclosed subject matter, employing the digital PLL, can force the phase difference value (e.g., the accumulated phase difference value) at the phase difference node to a fixed value (e.g., to 0 or another desired fixed value) during operation to invoke a holdover frequency for the digital PLL, which can provide a holdover capability, as more fully described herein. The disclosed subject matter can use this to hold the output clock at its current frequency, for example, if a fault is detected at the receiver input (e.g., if a drastic or undesired error occurs at the receiver).

In some embodiments, the digital PLL can comprise a proportional and integral filter that can include a proportional path and an integral path. A proportional path gain can be applied to the signal (e.g., accumulated phase difference) on the proportional path, wherein the proportional path gain can set or adjust the loop bandwidth for the digital PLL, wherein the loop bandwidth can relate to the low-pass filter bandwidth of the digital PLL. An integral path gain can be applied to the signal on the integral path, wherein the integral path gain can set or adjust the loop damping for the digital PLL, wherein the loop damping can adjust the acquisition time, stability, and peaking of the loop (e.g., the digital PLL). The digital PLL can have a desirable dynamic gain setting for desirably fast acquisition of the desired (e.g., target) frequency and phase at startup and stable control once the loop is locked.

The disclosed subject matter, through the use of a digital PLL having a discrete-time filter that can emulate an analog PLL, can allow the bandwidth to be precisely configured and for the behavior to be smooth, consistent, and predictable. The disclosed subject matter, through the use of such digital PLL, can precisely configure transient (e.g., convergence time) and steady-state (e.g., frequency response). Also, by applying a static or time-variant signal between the phase difference calculation and the proportional and integral filter, the digital PLL can modulate the phase of the output clock. This can be used to either self-test the transient or steady-state behavior or to modulate the output as a test mode for another downstream device. This also can be used to step the phase of the output clock by a desired fixed amount. This further can be helpful for test purposes or to precisely control the phase (or skew) between different outputs.

The proportional and integral filter can determine or generate a frequency offset based at least in part on the output from the proportional path and the output of the integral path. For example, the value (e.g., proportional path output value) at the output signal of the proportional path and the value (e.g., integral path output value) of the output signal of the integral path can be summed to generate or determine the frequency offset for the current cycle.

A generator component (e.g., increment-decrement generator) of the digital PLL can receive the frequency offset from the proportional and integral filter and can determine or generate the output phase information (e.g., increment request, decrement request, or no change request or signal) based at least in part on the frequency offset. In certain embodiments, the digital PLL can use counter overflow and underflow for increment and decrement generation by the generator component, as more fully described herein.

In some embodiments, the disclosed subject matter, employing the digital PLL, can use the steady-state value driving the increment-decrement generator as means for detecting the frequency difference between the recovered clock and the local fixed-frequency clock. In certain embodiments, the disclosed subject matter, employing the digital PLL, can force the output to a fixed-frequency offset by forcing the input to the increment-decrement generator to a desired fixed value (e.g., a desired frequency offset value) to provide a configurable and/or fixed frequency offset for the digital PLL, as more fully described herein. The disclosed subject matter can use this feature, for example, to generate an output fixed-frequency clock with a precisely controlled frequency offset from the reference fixed frequency clock. In still other embodiments, the digital PLL can detect out-of-range updates, such as, for example, updates greater than a 200 ppm frequency offset, as more fully described herein.

The digital PLL also can perform scaling (e.g., using a scaling function(s)) to control or adjust the output frequency of the digital PLL relative to the input frequency of the digital PLL. In some embodiments, the digital PLL can use a modulus counter for 1:N increment or decrement scaling of the input to the digital PLL and/or the feedback path of the digital PLL to facilitate desirable scaling (e.g., frequency scaling) of the output frequency of the digital PLL relative to the input frequency of the digital PLL (e.g., to upscale or downscale the output frequency relative to the input frequency), as more fully described herein. In other embodiments, the digital PLL use a modulus counter for M:N and/or N:M fractional increment or decrement scaling of the input to the digital PLL and/or the feedback path of the digital PLL to facilitate desirable scaling (e.g., frequency scaling) of the output frequency of the digital PLL relative to the input frequency of the digital PLL, as more fully described herein.

These and other aspects and embodiments of the disclosed subject matter will now be described with respect to the drawings.

FIG. 1 illustrates a block diagram of a non-limiting example system 100 that can employ a digital or virtual phase-locked loop (digital or virtual PLL) component to filter phase information (e.g., input phase information) for clock signals of a device, in accordance with various aspects and embodiments of the disclosed subject matter. The system 100 can be part of, employed by, or associated with a device (e.g., an electronic device). The device can be, for example, a communication device (e.g., a phone, a mobile phone, a computer, a laptop computer, an electronic pad or tablet, a television, an Internet Protocol television (IPTV), a set-top box, an electronic gaming device, electronic eyeglasses with communication functionality, an electronic watch with communication functionality, or other electronic bodywear with communication functionality, . . . ) or other type of electronic device that utilizes clock signals to facilitate operation of electronic circuitry of the device.

The system 100 can comprise a receiver component 102 that can receive signals (e.g., digital signals), comprising, for example, data, audio content, video content, and/or other information, from another device (e.g., another electronic device). The receiver component can comprise or be associated with a CDR unit 104 that can process the received signals to recover clock signals from the received signals. The receiver component 102 can decode the received signals, based at least in part on the clock signals, to recover the data from the received signals.

The system 100 also can comprise a core component 106 that can be associated with (e.g., communicatively connected to) an output of the receiver component 102. An input of the core component 106 can receive the data from the receiver component 102. The core component 106 can process the data, as desired, to generate processed data as an output.

An output of the core component 106 can be associated with a transmitter component 108 that can receive the processed data from the output of the core component 106. The transmitter component 108 can encode and/or otherwise further process the processed data for transmission, based at least in part on a clock signal, which can be generated, as more fully described herein. The transmitter component 108 can communicate the encoded data to a desired destination (e.g., another device).

The CDR unit 104 can be associated with (e.g., communicatively connected to) a phase interpolator (PI) 110 (e.g., a first or input phase interpolator) and a digital PLL component 112 (e.g., digital PLL), wherein each of the phase interpolator 110 and the digital PLL component 112 can receive phase modification requests (e.g., input phase modification requests) from the CDR unit 104. The phase interpolator 110 can recover or generate clock signals (e.g., recovered clock signals) based at least in part on the received phase modification requests. A phase modification request can comprise an increment request (e.g., an increment signal) to increment the phase of the clock by one step (e.g., by a fixed value, $\delta\phi$, such as, for example, 1/32 UI), a decrement request (e.g., a decrement signal) to decrement the phase of the clock by one step, or a no change request or signal that can indicate there is no change in phase of the clock being requested. The phase interpolator 110 can transmit the recovered clock signals back to the CDR unit 104 and/or to another desired component(s) of the system 100.

The digital PLL component 112, in response to receiving the phase modification requests from the CDR unit 104, can desirably filter the received phase modification requests to generate output (e.g., filtered) phase modification requests (e.g., an increment request, a decrement request, or a no change request or signal), based at least in part on the input phase modification requests, to facilitate transferring the clock across the device (e.g., a die of the device) to the transmitter component 108 and/or other component(s) of the device, as more fully described herein.

The digital PLL component 112 can be associated with (e.g., communicatively connected to) a phase interpolator 114 (e.g., a second or output phase interpolator). The digital PLL component 112 can transmit the output phase modification requests to the phase interpolator 114, which can receive such output phase modification requests. The phase interpolator 114 can determine or generate a clock signal for the transmitter component 108 based at least in part on the output phase modification requests, and can communicate such clock signal to the transmitter component 108 to facilitate operation of the transmitter component 108 to transmit the processed data to a desired destination (e.g., another device) based at least in part on (e.g., in accordance with) such clock signal.

In some embodiments, the digital PLL component 112 additionally or alternatively can communicate the output phase modification requests to another phase interpolator(s) 116 associated with another component(s) 118 of the device, wherein the other phase interpolator(s) 116 can receive such output phase modification requests. The other phase interpolator(s) 116 can determine or generate a clock signal for the other component(s) 118 based at least in part on the output phase modification requests, and can communicate such clock signal to the other component(s) 118 to facilitate operation of the other component(s) 118 based at least in part on (e.g., in accordance with) such clock signal.

In accordance with various embodiments, the digital PLL component 112 can comprise an accumulator component 120, a proportional and integral filter component 122, a generator component 124, and a feedback component 126. The accumulator component 120 can be associated with (e.g., communicatively connected to) an input of the digital PLL component 112. An output of the accumulator component 120 can be associated with an input of the proportional and integral filter component 122. An output of the proportional and integral filter component 122 can be associated with an input of the generator component 124. An output of the generator component 124 can be, or can be associated with, an output of the digital PLL component 112, and also can be associated with an input of the feedback component 126, which can be on a feedback path from the output of the generator component 124 to another input of the accumulator component 120, wherein an output of the feedback component 126 can be associated with the other input of the accumulator component 120.

The accumulator component 120 can receive the input phase modification requests from the phase interpolator 110 and can accumulate the input phase modification requests. The accumulator component 120 also can receive the output phase modification requests, or a scaled version of the output phase modification requests, from the generator component 124 via the feedback component 126 and feedback path 128. The accumulator component 120 can accumulate the output phase modification requests, or a scaled version of the output phase modification requests, received via the feedback path 128. In certain embodiments, the accumulator component 120 can be or comprise a common accumulator that can be used for input and output whereby the input phase request value can be added and the output phase request value can be subtracted from the accumulator value on each cycle, wherein the input phase request value can be determined based at least in part on the received input phase modification requests, and wherein the output phase request value can be determined based at least in part on the received output phase modification requests or scaled versions of the output phase modification requests. The accumulator component 120 can generate a phase difference value, $\Delta P_{in}(n)$, which can be the difference in accumulated phase for the current cycle, as an output based at least in part on the input phase modification requests (e.g., the accumulated input phase modification requests), $\delta P_{in}(n)$, and the output phase modification requests (e.g., the accumulated output phase modification requests), $\delta P_{out}(n)$, received by the accumulator component 120 (e.g., based at least in part on the difference between the input phase request value and the output phase request value, wherein the accumulator component 120 can be updated with the resulting difference between the input phase request value and the output phase request value), wherein the output phase modification requests can be processed, modified, or scaled by the feedback component 126, as more fully described herein.

The proportional and integral filter component 122 can receive the accumulated phase difference for the current cycle, $\Delta P_{in}(n)$, from the accumulator component 120. The proportional and integral filter component 122 can comprise a proportional path (not shown in FIG. 1) and an integral path (not shown in FIG. 1) (e.g., parallel proportional and integral paths). In accordance with various embodiments, on the proportional path, the proportional and integral filter component 122 can apply a first gain (e.g., proportional gain, GP) to the accumulated phase difference, wherein the proportional path can apply the gain (e.g., the first gain) without filtering and can set the loop bandwidth, $f_b$, for the digital PLL component 112, as more fully described herein. On the integral path, the proportional and integral filter component 122 can apply a second gain (e.g., integral gain, GI) to the accumulated phase difference, wherein the proportional path can apply the second gain and can act as an integrator by adding the input value (e.g., the accumulated phase difference value for the current cycle with the second gain applied to it) to a current output value (e.g., the value from the previous cycle) on the integral path (e.g., using an accumulator (not shown in FIG. 1)), as more fully described herein. The second gain can set the damping factor, ζ, of the digital PLL component 112.

The digital PLL component 112, employing the proportional and integral filter component 122, can desirably filter the input signal (e.g., input phase data, such as input phase modification requests) to reduce jitter, phase noise, and/or other undesirable noise or characteristics of the input signal. In accordance with various embodiments, the proportional and integral filter component 122 can be configurable to adjust the bandwidth for the loop and/or the damping factor. For example, by varying (e.g., adjusting) the first gain (e.g., proportional gain), the bandwidth for the loop can be adjusted or set over an approximate range of 125 kHz to 4.0 MHz. As another example, by varying the second gain (e.g., integral gain), the damping factor can be adjusted or set over a range of 1.0 to 4.0. It is to be appreciated and understood, that, in accordance with other embodiments, as desired, the first and second gains can be adjusted and set to achieve a loop bandwidth below or above the approximate range of 125 kHz to 4.0 MHz, and/or a damping factor below of above the range of 1.0 to 4.0. It is noted though that, for example, with regard to the damping factor, a damping factor below 1.0 can result in the loop becoming unstable, a damping factor above 4.0 can reduce the tracking accuracy, as more fully described herein.

The proportional and integral filter component 122 can sum the respective output values of the proportional path and the integral path to generate a frequency offset value (e.g., a frequency offset control), as an output. The frequency offset value can be utilized to facilitate determining and generating phase modification requests (e.g., output phase modification requests).

The generator component 124 can receive the frequency offset value from the proportional and integral filter component 122. The generator component 124 can generate phase modification requests (e.g., output phase modification requests) based at least in part on the frequency offset value, as more fully described herein. The phase modification request (e.g., increment request, decrement request, or no change request or signal) can be transmitted from the output of the generator component 124 to the phase interpolator 114 associated with the transmitter component 108 and/or to another phase interpolator(s) 116 associated with another component(s) 118 of the system 100, wherein the phase modification request can be utilized to facilitate generating a clock(s) for the transmitter component 108 and/or other component(s) 118.

These and other aspect and embodiments of the disclosed subject matter will now be described with regard to the other drawings.

In a basic case, PI update requests can occur at a rate that is usually no higher than half the frequency of the digital core clock. This means that single PI updates can be transmitted without any parallelization. The update often can comprise a message with 3 possible states: no change, increment phase by one step, or decrement phase by one step. A phase increment or decrement can be a change in phase of a fixed value δϕ (e.g., ⅟₃₂ UI). This alternately can be interpreted as a signed number in the set {−δϕ, 0, +δϕ}. A practical way to filter these requests properly can be to implement or emulate a phase-locked loop in the digital domain.

Figure 2:
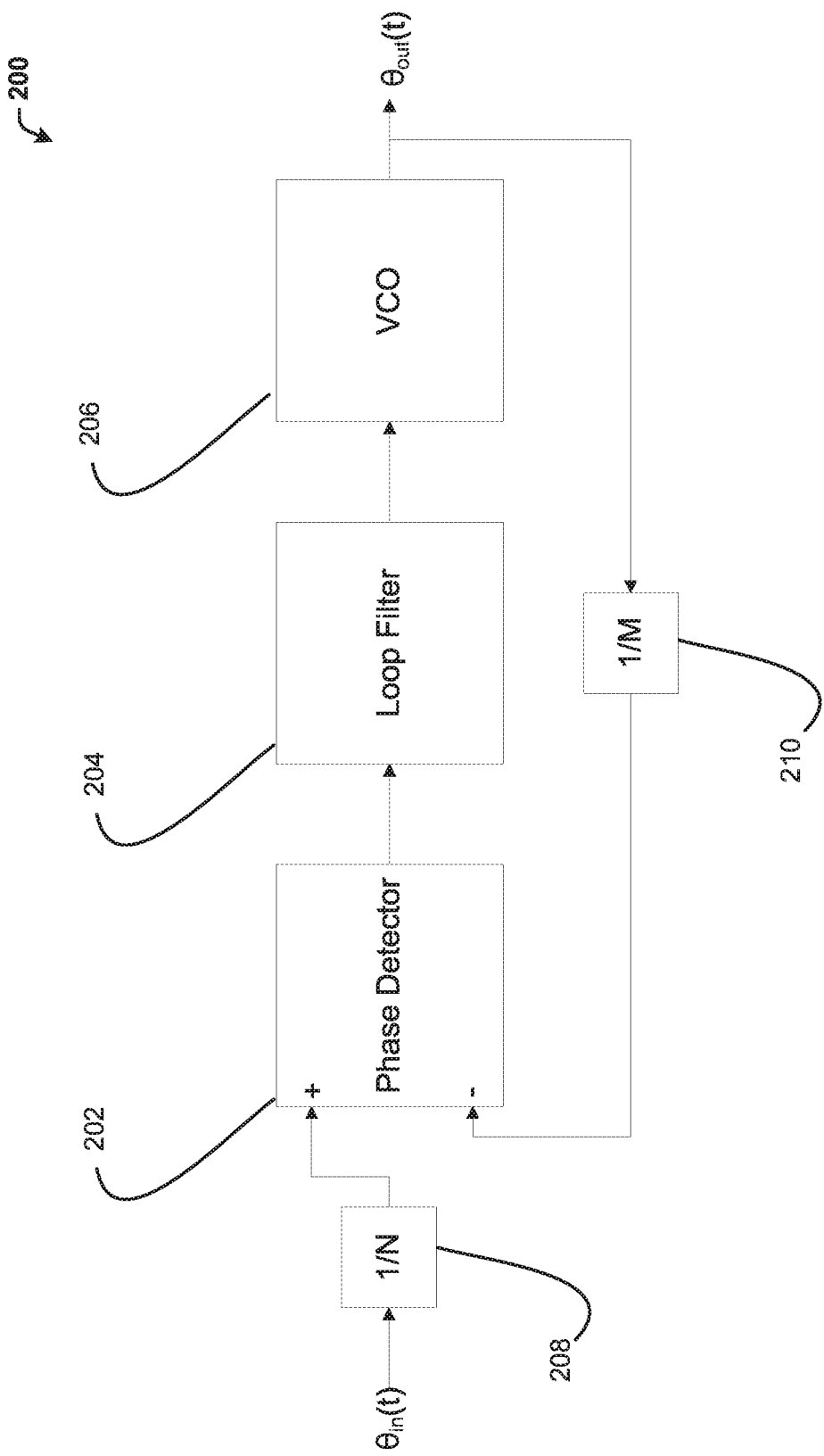
FIG. 2 depicts a block diagram of an example analog phase-locked loop (analog PLL), in accordance with various aspects of this disclosure.

Referring to FIG. 2, FIG. 2 depicts a non-limiting exemplary block diagram of an analog PLL 200, in accordance with various aspects of this disclosure. The analog PLL 200 can comprise, for example, a phase detector 202, a loop filter 204, a voltage controlled oscillator (VCO) 206, a clock divider 208, a clock divider 210, and/or other components. In some embodiments, an analog PLL can consume, for example, 200 milliwatts (mW) continuously in order to support its various analog components.

The analog PLL 200 can receive an input clock signal θ$_{in}$(t) that, in some embodiments, can be multiplied by a desired factor, such as factor 1/N 212. The phase detector 202 can receive the input clock signal or modified (e.g., multiplied) input clock signal as well as a feedback signal, via feedback path 214, from the output of the VCO 206. In accordance with various embodiments, the feedback signal can be the output θ$_{out}$(t) of the VCO 206 or a modified output signal that can be generated by multiplying the output θ$_{out}$(t) by a desired factor, such as factor 1/M 216. The phase detector 202 can process the received input signals based at least in part on a phase detector transfer function, such as more fully described herein, to produce an output from the phase detector 202. The output of the phase detector 202 can be input to the loop filter 204, which can process such input based at least in part on the loop filter transfer function, such as more fully described herein. The output of the loop filter 204 can be input to the VCO 206, which can process its input signal to generate the output θ$_{out}$(t) of the analog PLL 200.

A phase-locked loop, such as analog PLL 200, can have a frequency source which can increase or advance phase in time at a rate proportional to a control input (e.g., voltage). The control input can be determined by a control loop. The control loop can start by comparing the phase at the output against the phase at the input, giving a difference in phase which can be corrected. This phase difference can be used to update an integration stage, which can adjust the VCO control input such that the output frequency can track the input frequency. For loop stability, a proportional path can be provided in parallel with the integration path, and the output of the two paths can be summed together and used as the current VCO control input.

The phase detector 202 can take the difference in phase between the input clock 208 and the output clock 210. In some embodiments, the input and output clocks optionally can be divided by N and M, respectively, to achieve an M/N frequency multiplication. In the case where M=N, the output frequency of the analog PLL 200 can be the same as the input frequency of the analog PLL 200. There can be some embodiments where no frequency multiplication is desired, wherein M and N can be equal to 1.

The response, θ$_o$(s), of the analog PLL 200 can be as follows in Equation (Eq.) (1):

$$\theta_o(s) = (\theta_i(s) - \theta_o(s)) \cdot K_d \cdot K_h \cdot \frac{(\omega_2 + s)}{s} \cdot \frac{K_o}{s}, \qquad \text{Eq. (1)}$$

wherein $K_d$ can represent the transfer function of the phase detector 202, $$K_h \cdot \frac{(\omega_2 + s)}{s}$$

can represent the transfer function of the loop filter 204, and $$\frac{K_o}{s}$$

can represent the transfer function of the VCO 206. Solving for $\theta_o(s)/\theta_i(s)$ and substituting K for $K_d \cdot K_h \cdot K_o$:

$$\frac{\theta_o(s)}{\theta_i(s)} = \frac{Ks + K\omega_2}{s^2 + Ks + K\omega_2}. \quad \text{Eq. (2)}$$

In Eq. (2), K can represent the PLL Bode (or asymptotic) bandwidth. The factor $\omega_2$ can be the zero frequency that sets the stability of the loop. The loop damping factor can be given, for example, by Eq. 3, as follows:

$$\zeta_h = \frac{1}{2}\sqrt{\frac{K}{\omega_2}}. \quad \text{Eq. (3)}$$

The loop can be critically damped, for example, when the damping factor is 1 or $K/\omega_2$ is equal to 4. Critical damping can provide the best possible tracking. Reducing this ratio can result in the loop becoming less stable or unstable, the error between input and output can overshoot, and phase noise can be emphasized at frequencies lower than the bandwidth. Increasing this ratio can reduce the tracking accuracy but can provide a stable response and can reduce phase noise emphasis at frequencies below the PLL bandwidth. The loop filter transfer function can be modeled as parallel paths with a proportional gain $K_h$ on one path and integral gain $K_h \cdot \omega_2/s$ on the other path.

Figure 3:
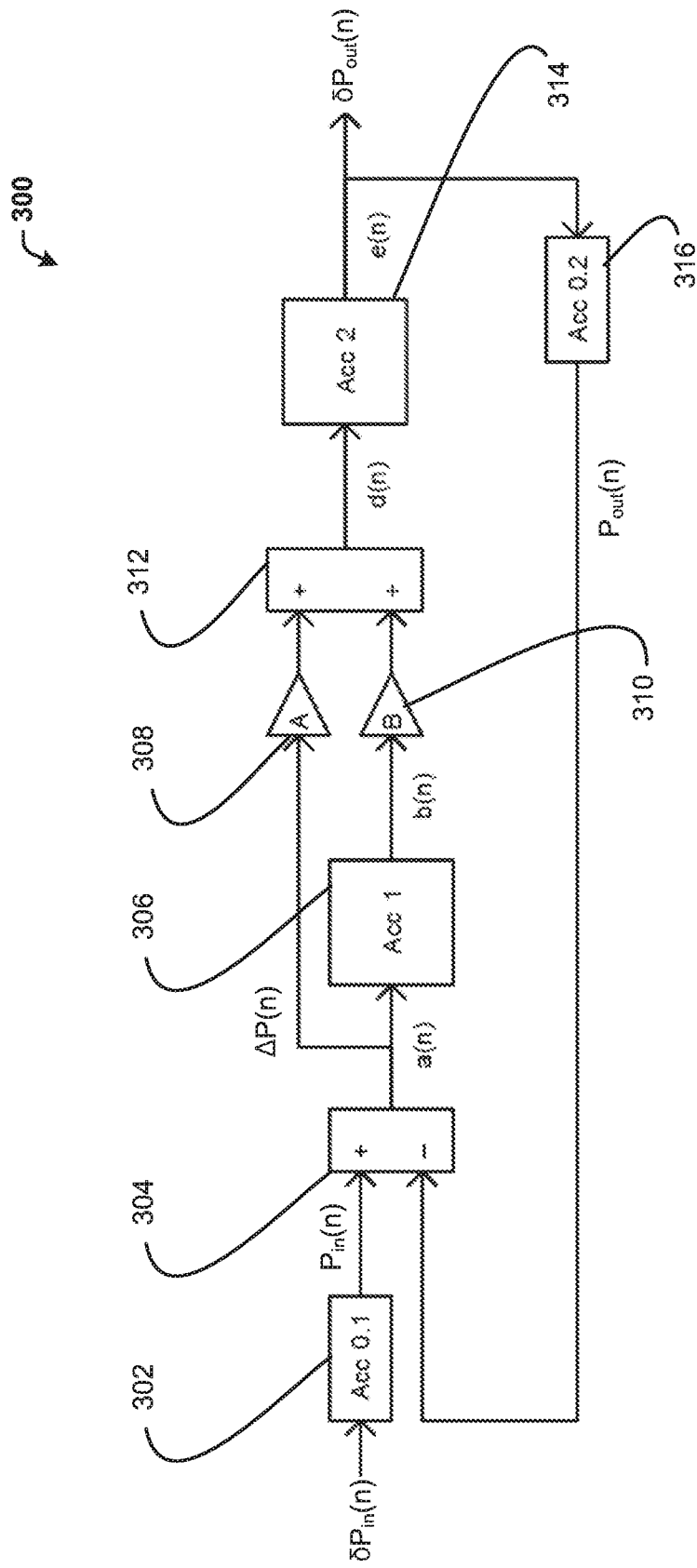
FIG. 3 illustrates a block diagram of a non-limiting exemplary digital PLL component, in accordance with various aspects and embodiments of the disclosed subject matter.

Referring to FIG. 3, FIG. 3 illustrates a block diagram of a non-limiting exemplary digital PLL component 300, in accordance with various aspects and embodiments of the disclosed subject matter. The digital PLL component 300 can comprise, for example, an accumulator component 302 (Acc 0.1), a phase differentiator component 304, an accumulator component 306 (Acc 1), a gain component 308 (gain A), a gain component 310 (gain B), a summing component 312, an accumulator component 314 (Acc 2), an accumulator component 316 (Acc 0.2), and/or other components.

A digital PLL, such as digital PLL component 300, can consume a relatively small amount (e.g., a small fraction) of the power, as compared to the amount of power that typically can be consumed by an analog PLL, such as analog PLL 200. As a non-limiting example, a digital PLL, such as digital PLL component 300, can consume 25 mW, although other types of digital PLLs can consume less or more than 25 mW.

In this non-limiting embodiment, it can be assumed that the input is based at least in part on increment and decrement requests for the phase interpolator. An increment or decrement can cause a change in phase of some fraction (e.g., 1/32) of a unit interval (UI). In this non-limiting embodiment, an increment can be considered as a +1, a decrement can be considered as a −1, and a signal that is neither an increment or decrement can be considered as 0. The current phase values at the input and output can be determined by integrating (or accumulating) the increment and decrement requests by the accumulator component 302 and the accumulator component 316. The difference in phase, ΔP(n), can be determined by subtracting the accumulated output phase, $P_{out}(n)$, from the accumulated input phase, $P_{in}(n)$, as generated by the phase differentiator component 304.

At the node at the output of the phase differentiator component 304, the value of a(n) at such node can be determined, for example, using Eq. (4) as follows:

$$a(n)=a(n-1)+\delta\phi_{in}(n)-\delta P_{out}(n), \quad \text{Eq. (4)}$$

wherein n can be the number of the cycle (e.g., n can be the current cycle), a(n) can be the value at node a for the current cycle, a(n−1) can be the value at node a for the previous cycle, $\delta P_{in}(n)$ can be the input phase modification requests (e.g., increment request (e.g., +1), decrement request (e.g., −1), or no change request (e.g., 0)) being received by the digital PLL component 300 from a phase interpolator associated with, for example, the receiver, and $\delta P_{out}(n)$ can be the phase modification requests (e.g., increment request, decrement request, or no change request) output from the digital PLL component 300.

On the integral path, at the node at the output of the accumulator component 306, the value of b(n) at such node can be determined, for example, using Eq. (5) as follows:

$$b(n)=a(n)+b(n-1), \quad \text{Eq. (5)}$$

wherein b(n) can be the value at node b (e.g., the node between the accumulator component 306 and the gain component 310) for the current cycle, a(n) can be the value at node a for the current cycle, and b(n−1) can be the value at node b for the previous cycle.

The phase difference can be processed by a proportional/integral filter of the digital PLL component 300 by multiplying by the gain (e.g., gain value A) of the gain component 308 on the proportional path and by accumulating by the accumulator component 306 and multiplying by the gain (e.g., gain value B) of the gain component 310 on the integral path. The proportional and integral paths (e.g., the outputs from the gain component 308 and the gain component 310) can be summed together to provide the input, d(n), to the frequency accumulator, accumulator component 314, wherein the input, d(n), can be representative of the frequency offset. At the node of the output of the summing component 312, the value of d(n) at such node can be determined, for example, according to Eq. (6):

$$d(n)=a(n)*A+b(n)*B, \quad \text{Eq. (6)}$$

wherein a(n) can be the value at node a for the current cycle, A can be the gain level from the gain component 308, b(n) can be the value at node b for the current cycle, and B can be the gain level from the gain component 310.

Increment and decrement signals can be regularly generated by the frequency accumulator component 314 (e.g., at node e(n)), where an increment (e.g., an increment request signal, which can have a +1 value) can be generated by the frequency accumulator component 314 when the frequency accumulator component 314 overflows, a decrement (e.g., a decrement request signal, which can have a −1 value) can be generated by the frequency accumulator component 314 when the frequency accumulator component 314 underflows, or a no change signal (e.g., which can have a 0 value) can be generated when no increment or decrement signal is desired.

With further regard to the accumulator component 306, the accumulator component 306 typically does not reach the limits of its range, either lower limit (e.g., −1024) or upper limit (e.g. +1023), and it can be desirable for the accumulator component 306 to not reach either its lower limit or higher limit. However, if the accumulator component 306 does reach the lower limit or upper limit of its range, the value can saturate at the limit until a value of a(n) moves the value away from the limit. As for the accumulator component 314, the accumulator component 314 can roll over when it reaches either the lower limit or upper limit, generating an underflow if it crosses the 0 limit when subtracting or generating an overflow if it crosses the maximum value limit when adding.

For a non-zero frequency offset, the accumulator component 302 (e.g., increment/decrement accumulator) and accumulator component 316 can continue to increase or decrease indefinitely. As such, the accumulator component 302 or accumulator component 316 can eventually overflow, and can either have to be infinitely large or can have to rollover, wherein it can be desirable to take such rollover into consideration when calculating the phase difference. This form of the digital PLL component 300 can be provided as a conceptual basis, whereas the form of the digital PLL component in FIG. 4 can be a relatively less complex version of the digital PLL component that can accomplish the same effect of the digital PLL component without the inevitable overflow.

Figure 4:
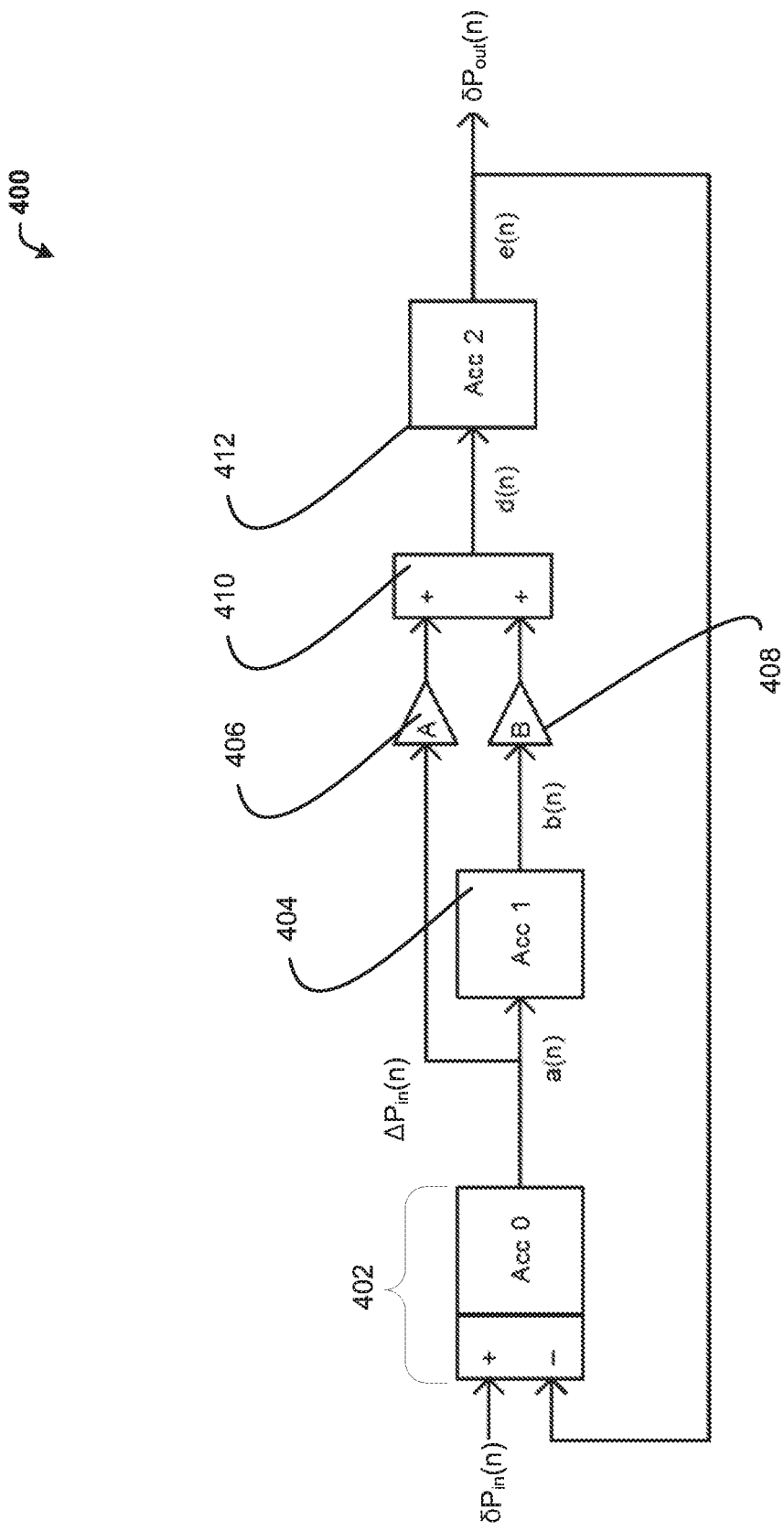
FIG. 4 presents a block diagram of a non-limiting exemplary digital PLL component, in accordance with various aspects and embodiments of the disclosed subject matter.

In that regard, turning now to FIG. 4, FIG. 4 presents a block diagram of a non-limiting exemplary digital PLL component 400 in accordance with various aspects and embodiments of the disclosed subject matter. For example, the digital PLL component 400 can comprise an accumulator component 402 (Acc 0), an accumulator component 404 (Acc 1), a gain component 406 (gain A), a gain component 408 (gain B), a summing component 410, an accumulator component 412 (Acc 2), and/or other desired components.

Since the addition of the input and output phase can be linear, the accumulator component 402 can be a common accumulator, as shown in FIG. 4, which can be used for input and output whereby the input phase request value ($\delta P_{in}(n)$) can be added and the output phase request value ($\delta P_{out}(n)$) can be subtracted from the accumulator value on each cycle. In the steady-state, the phase accumulation on the input and output of the digital PLL component 400 can be the same, and the loop of the digital PLL component 400 can adjust the output phase such that the output of the accumulator component 402 (e.g., phase accumulator) can tend towards a value of zero. In the description that follows for digital PLL components, this form can be assumed.

At the node at the output of the accumulator component 402, the value of a(n) at such node can be determined, for example, using Eq. (4), as disclosed herein. On the integral path, at the node at the output of the accumulator component 404, the value of b(n) at such node can be determined, for example, using Eq. (5), as disclosed herein. At the node of the output of the summing component 410, the value of d(n) at such node can be determined, for example, using Eq. (6), as disclosed herein.

Increment and decrement signals can be regularly generated by the accumulator component 412 (e.g., at node e(n)), where an increment (e.g., an increment request signal, which can have a +1 value) can be generated by the accumulator component 412 when the frequency accumulator component 412 overflows, a decrement (e.g., a decrement request signal, which can have a −1 value) can be generated by the frequency accumulator component 412 when the accumulator component 412 underflows, or a no change signal (e.g., which can have a 0 value) can be generated when no increment or decrement signal is desired.

Figure 5:
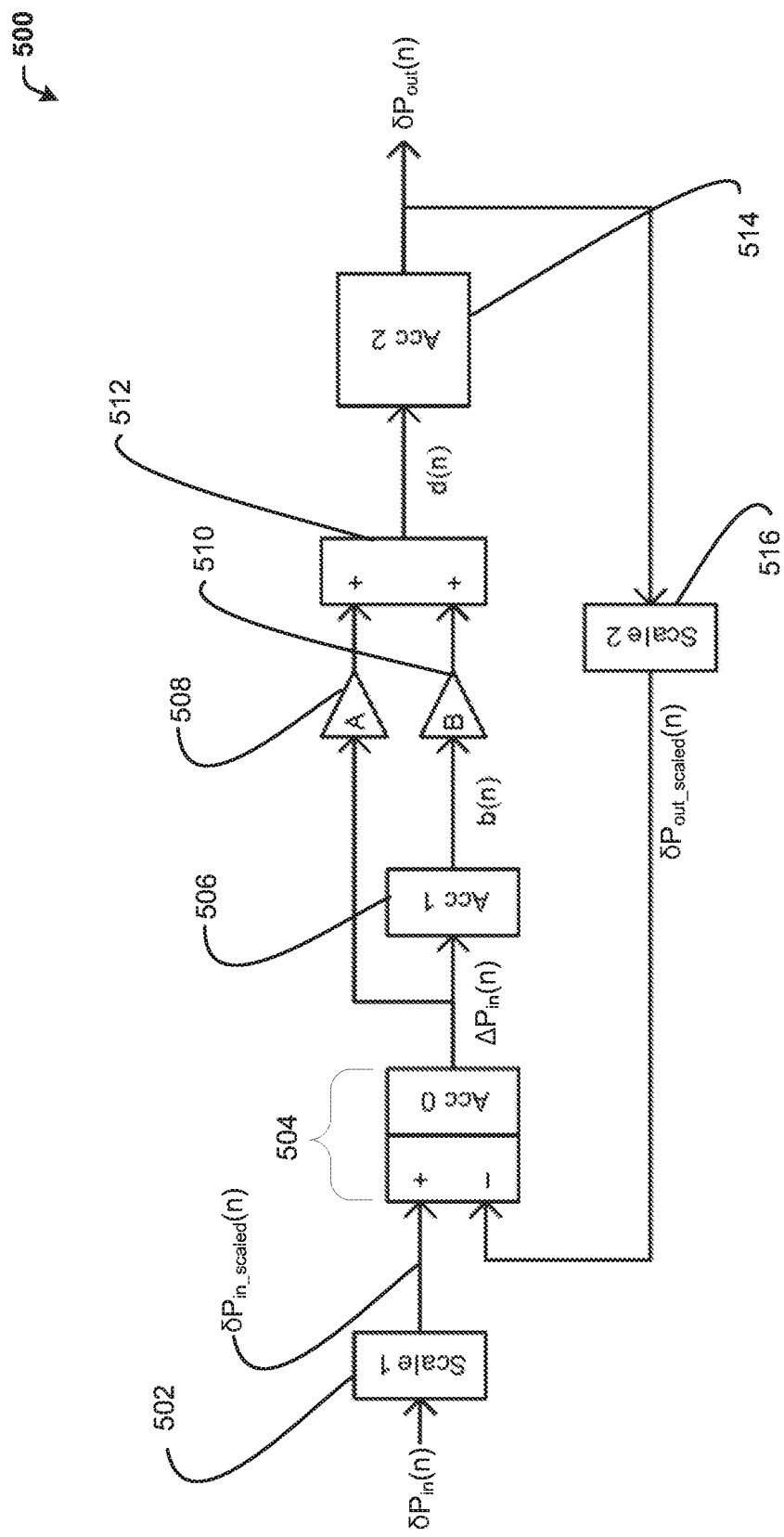
FIG. 5 illustrates a block diagram of another non-limiting exemplary digital PLL component that can employ frequency scaling, in accordance with various aspects and embodiments of the disclosed subject matter.

Referring now to FIG. 5, FIG. 5 illustrates a block diagram of another non-limiting exemplary digital PLL component 500 that can employ frequency scaling, in accordance with various aspects and embodiments of the disclosed subject matter. The digital PLL component 500 can comprise, for example, a scale component 502 (Scale 1), an accumulator component 504 (Acc 0), an accumulator component 506 (Acc 1), a gain component 508 (e.g., having gain A), a gain component 510 (e.g., having gain B), a summing component 512, an accumulator component 514 (Acc 2), a scale component 516 (Scale 2), and/or other components.

The scale component 502 can receive input phase information ($\delta P_n(n)$) (e.g., input phase modification requests) from a CDR unit associated with, for example, a receiver of the device (e.g., communication device), wherein the CDR unit also can be associated with a first phase interpolator that can receive the input phase information, as more fully described herein. An input of the accumulator component 504 can be associated with (e.g., communicatively connected to) the output of the scale component 502. Another input of the accumulator component 504 can be associated with a feedback path of the digital PLL component 500 that can be associated with (e.g., indirectly associated with) an output of the accumulator component 514 (e.g., an increment/decrement generator).

The output of the accumulator component 504 can be associated with (e.g., communicatively connected to) a proportional and integral filter of the digital PLL component 500 such that, along the proportional path, the output of the accumulator component 504 can be associated with the input of the gain component 508, and, along the integral path, the output of the accumulator component 504 can be associated with the accumulator component 506, wherein the output of the accumulator component 506 can be associated with the input of the gain component 510. The output of the gain component 508 and the output of the gain component 510 can be associated with respective inputs of the summing component 512. The output of the summing component 512 can be associated with the input of the accumulator component 514. The output of the accumulator component 514 can be associated with an input of the scale component 516, wherein an output of the scale component 516 can be associated with the other input of the accumulator component 504.

The digital PLL components described in FIG. 3 and FIG. 4 assumed that the frequency generated by the input and output phase interpolators are the same. However, for many applications the output frequency can be scaled up or down by a rational factor M:N, wherein M and N can be integers. For example, when encoding and decoding the IEEE 802.3 RS(544,514) FEC, to comply with such standard, it can be desired to scale the frequency between 25.78125 GHz for the uncoded signal (e.g., at the input of the device) and 26.5625 GHz for the coded signal (e.g., at the output of the device), which can be a ratio of 34:33. To achieve this 34:33 scaling, a first scale function (e.g., having a first scaled value) can be applied or added to the input ($\delta P_{in}(n)$) using the scale component 502, or a second scale function (e.g., having a second scaled value) can be applied or added to the feedback signal being transmitted from the output ($\delta P_{out}(n)$), or both a first scale function and second scale function can be applied. The first and second scale functions can take many forms, all of which are considered to be part of the disclosed subject matter. Some of these are described herein.

In one non-limiting embodiment, the digital PLL component 500 can scale the input to output frequency of the digital PLL component 500 by a factor of M:N by dividing the input by a factor of N and the output feedback by a factor of M. Such division can be accomplished by the scale component 502 or scale component 516 by forwarding one increment or decrement once N or M net increments or decrements, respectively, are accumulated. In some embodiments, the digital PLL component 500 can implement this, for example, by having the accumulator component 514 be a rollover, modulus M or N accumulator that can send one increment (e.g., increment request) when it overflows and one decrement (e.g., decrement request) when it underflows. This technique can be relatively less complex. However, there can be certain practical problems with this technique. One problem can be that it can reduce the rate or amount of feedback to the input of the digital PLL component 500, which can effectively reduce the sampling rate, which can lead to less stability of the digital PLL component 500, and eliminate desirable (e.g., valuable) information, which can lead to less accuracy by the digital PLL component 500. Another problem can be that the loop gain of the digital PLL component 500 can be reduced, and, as a result, higher scaling factors potentially can be desirable or required on the forward path.

In another non-limiting embodiment, the digital PLL component 500 can scale the input to output frequency of the digital PLL component 500 by providing or implementing fractional scaling either on the input of the digital PLL component 500 using the scale component 502 (e.g., applying a first scale value) or on the feedback signal of the feedback path of the digital PLL component 500 using the scale component 516 (e.g., applying a second scale value). When upscaling the input to output frequency of the digital PLL component 500 (e.g., when M>N), the scale component 502 can forward the input without modification, and the scale component 516 can send (e.g., transmit) N increments or decrements for every M net increments or decrements (e.g., increment requests or decrement requests) received by the digital PLL component 500. The digital PLL component 500 can accomplish this by updating a rollover, modulus M counter by +N for an increment or by −N for a decrement. An increment can be sent when the rollover, modulus M counter overflows, and a decrement can be sent when the rollover, modulus M counter underflows. When downscaling the input to output frequency (e.g., N>M), the scale component 516 can forward the input without modification, and the scale component 502 can send M increments or decrements for every N net increments or decrements received. The digital PLL component 500 can accomplish this by updating a rollover, modulus N counter by +M for an increment or −M for a decrement. The accumulator component 514 can send an increment when the rollover, modulus N counter overflows and can send a decrement when the rollover, modulus N counter underflows. This technique of such embodiment can work in a desirable manner, for example, if a single increment or decrement can be processed on each update with respect to the digital PLL component 500.

In still another non-limiting embodiment, the digital PLL component 500 can provide fractional scaling on the feedback path by removing or adding increments or decrements. The digital PLL component 500 can accomplish upscaling (M>N) of the input to output frequency by removing (M−N) increments or decrements for every M increments or decrements. The digital PLL component 500 can accomplish downscaling (N>M) of the input to output frequency by adding (N−M) increments for every M increments or decrements. For instance, to upscale the input to output frequency by 34:33, the feedback path can inhibit one increment after a net of 34 increments are received or can inhibit one decrement after a net of 34 decrements are received. Similarly, to downscale the input to output frequency by 33:34, the feedback path can insert one extra increment after a net of 33 increments are received or can add one extra decrement after a net of 33 decrements are received. This technique of this embodiment can work well, for example, if no more than one increment or decrement is generated by the digital PLL component 500 on each cycle.

It is to be appreciated and understood that, in accordance with various embodiments, there can be additional ways or techniques to address the frequency scaling for the digital PLL component and/or different scaling employed besides 34:33 or 33:34. All such additional ways or techniques to address the frequency scaling are considered to be part of the disclosed subject matter.

At the node at the output of the accumulator component 504, the value of $\Delta P_{in}(n)$ at such node can be determined, for example, using Eq. (7) as follows:

$$\Delta P_{in}(n) = \Delta P_{in}(n-1) + \delta P_{in\_scaled}(n) - \delta P_{out\_scaled}(n), \quad \text{Eq. (7)}$$

wherein n can be the number of the cycle (e.g., n can be the current cycle), $\Delta P_{in}(n)$ can be the accumulated phase difference for the current cycle, $\Delta P_{in}(n-1)$ can be the value of the accumulated phase difference for the previous cycle, $\delta P_n(n)$ can be the input phase modification requests (e.g., increment request, decrement request, or no change request) being received by the digital PLL component 500 (e.g., scale component 502 of the digital PLL component 500) from a CDR unit associated with, for example, the receiver, $\delta P_{in\_scaled}(n)$ can be the scaled version of the input phase modification requests output from the scale component 502 after scaling (if any) is performed on an input phase modification request by the scale component 502, $\delta P_{out}(n)$ can be the phase modification requests (e.g., increment request, decrement request, or no change request) output from the digital PLL component 500, and $\delta P_{out\_scaled}(n)$ can be the scaled version of the phase modification requests output from the scale component 516 after scaling (if any) is performed on a phase modification request by the scale component 516. If no scaling is performed on an input phase modification request by the scale component 502, $\delta P_{in\_scaled}(n)$ can equal $\delta P_{in}(n)$. If no scaling is performed on a phase modification request by the scale component 516, $\delta P_{out\_scaled}(n)$ can equal $\delta P_{out}(n)$.

On the integral path, at the node at the output of the accumulator component 506, the value of b(n) at such node can be determined, for example, using Eq. (8) as follows:

$$b(n) = b(n-1) + \Delta P_{in}(n), \quad \text{Eq. (8)}$$

wherein b(n) can be the value at node b (e.g., the node between the accumulator component 506 and the gain component 510) for the current cycle, b(n−1) can be the value at node b for the previous cycle, and $\Delta P_{in}(n)$ can be the value of the phase difference for the current cycle.

The phase difference can be processed by the proportional/integral filter of the digital PLL component 500 by multiplying by the gain (e.g., gain value A) of the gain component 508 on the proportional path and by accumulating by the accumulator component 506 and multiplying by the gain (e.g., gain value B) of the gain component 510 on the integral path. The proportional and integral paths (e.g., the outputs from the gain component 508 and the gain component 510) can be summed together, by the summing component 512, to provide the input, d(n), which can be representative of the frequency offset, to the frequency accumulator, accumulator component 514. At the node of the output of the summing component 512, the value of d(n) at such node can be determined, for example, according to Eq. (9):

$$d(n)=\Delta P_{in}(n)*A+b(n)*B,\qquad\text{Eq. (9)}$$

wherein $\Delta P_{in}(n)$ can be the value of the phase difference for the current cycle, A can be the gain level from the gain component 508, b(n) can be the value at node b for the current cycle, and B can be the gain level from the gain component 510.

Figure 6:
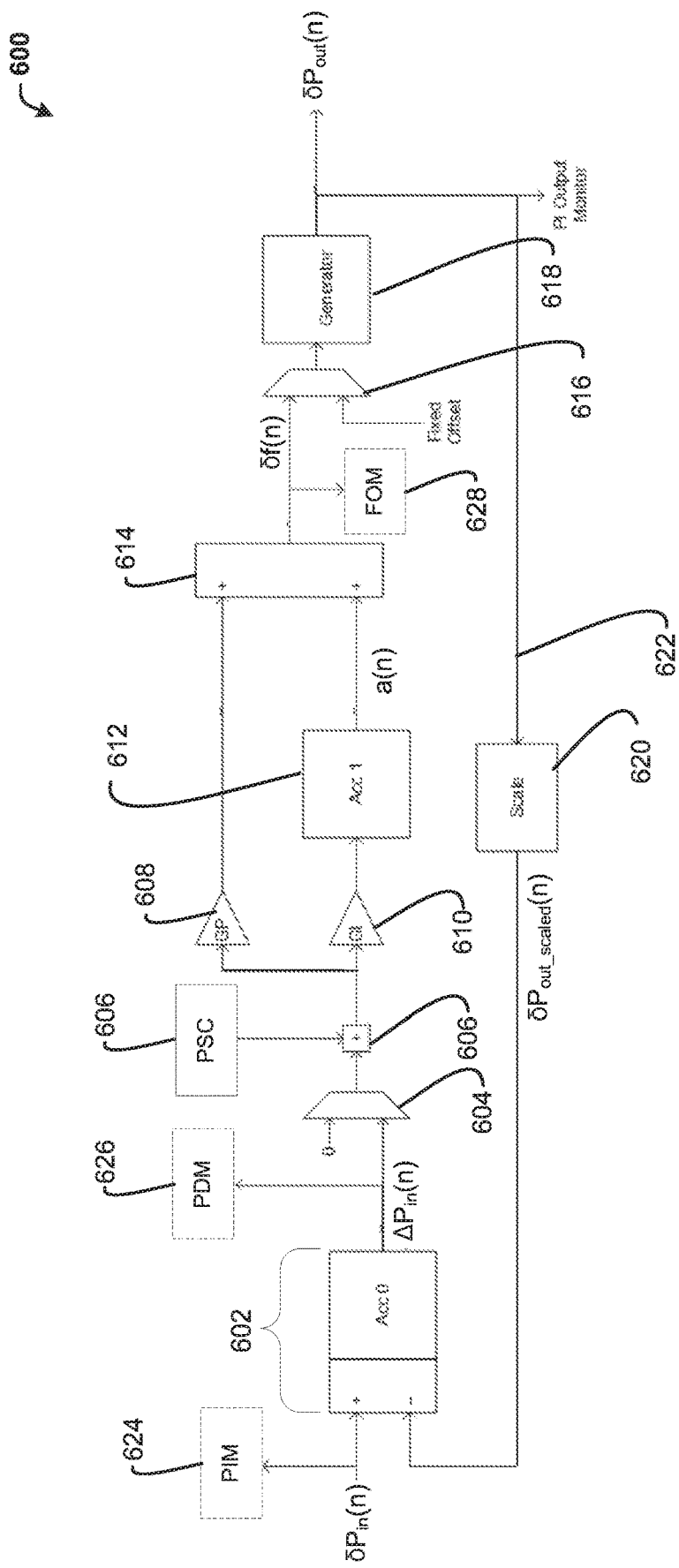
FIG. 6 depicts a block diagram of still another non-limiting exemplary digital PLL component, in accordance with various aspects and embodiments of the disclosed subject matter.

Referring now to FIG. 6, FIG. 6 depicts a block diagram of still another non-limiting exemplary digital PLL component 600, in accordance with various aspects and embodiments of the disclosed subject matter. The digital PLL component 600 can be employed as a PI controller loop, for example. The digital PLL component 600 can comprise an accumulator component 602 (Acc 0), a holdover component 604, a phase step component 606 (PSC), a gain-proportional path (GP) component 608, a gain-integral path (GI) component 610, an accumulator component 612 (Acc 1), a summing component 614, a free run control component 616, a generator component 618 (e.g., Generator), a scale component 620 (Scale) in a feedback path 622, and/or other desired components.

The accumulator component 602 can receive input phase information (e.g., phase modification requests, such as increment requests, decrement requests, or no change requests), $\delta P_{in}(n)$, from a CDR unit, which can be associated with a receiver of the device, for example, wherein the CDR unit also can be associated with a phase interpolator (e.g., first phase interpolator) that can receive the input phase information from the CDR unit, as more fully described herein. In some embodiments, the input phase information can comprise 5 bits signed, although, in other embodiments, a different desired number of bits can be utilized.

The accumulator component 602 also can receive output phase information (e.g., output phase modification requests, such as increment requests, decrement requests, or no change requests), $\delta P_{out}(n)$, from the output of the digital PLL component 600 via the feedback path 622, wherein the scale component 620 can scale the output phase information or can have the output phase information pass through without being scaled depending in part on the conditions of the digital PLL component 600, as more fully described herein. In certain embodiments, the output phase information or scaled output phase information can comprise 3 bits signed, although, in other embodiments, a different desired number of bits can be utilized. At its output, the accumulator component 602 can produce a value that can be the difference in the accumulated phase, $\Delta P_{in}(n)$. The difference in the accumulated phase, $\Delta P_{in}(n)$, can be determined (e.g., calculated), for example, using the following Eq. (10):

$$\Delta P_{in}(n)=\Delta P_{in}(n-1)+\delta\phi_{in}(n)-\delta P_{out\_scaled}(n),\qquad\text{Eq. (10)}$$

wherein n can be the number of the cycle (e.g., n can be the current cycle), $\Delta P_{in}(n-1)$ can be the value of the accumulated phase difference for the previous cycle, $\delta P_n(n)$ can be the input phase modification requests (e.g., increment request, decrement request, or no change request) being received by the digital PLL component 600 from a CDR unit associated with, for example, the receiver, $\delta P_{out}(n)$ can be the phase modification requests (e.g., increment request, decrement request, or no change request) output by the generator component 618 of the digital PLL component 600, and $\delta P_{out\_scaled}(n)$ can be the scaled version of the phase modification requests output from the scale component 620 after scaling (if any) is performed on a phase modification request ($\delta P_{out}(n)$) by the scale component 620. If no scaling is performed on a phase modification request by the scale component 620, $P_{out\_scaled}(n)$ can equal $\delta P_{out}(n)$.

In some embodiments, the output, $\Delta P_{in}(n)$, of the accumulator component 602 can be input to the holdover component 604, which can be utilized for holdover control of the digital PLL component 600, as more fully described herein. In some embodiments, the output, $\Delta P_{in}(n)$, can comprise 8 bits signed, although, in other embodiments, a different desired number of bits can be utilized for the digital PLL component 600. In certain embodiments, the holdover component 604 can be or can comprise a multiplexer. In example embodiments where the holdover component 604 is or comprises a multiplexer, one of the inputs to the multiplexer can be the accumulated phase difference and another input to the multiplexer can be a desired or default value (e.g., 0 or another desired value). The output from the holdover component 604 can be input to the phase step component 606, which can provide phase step control for the digital PLL component 600, as more fully described herein.

The output (e.g., output signal or value) of the phase step component 606 can be transmitted to the proportional and integral filter, wherein such output of the phase step component 606 can be provided to the input of the GP component 608 and the input of the GI component 610. In certain embodiments, the output of the phase step component 606 can comprise 8 bits signed, although, in other embodiments, a different desired number of bits can be utilized. In certain embodiments, the default value of the phase step component can be 0, although in other embodiments, the default value can be another desired value besides 0.

The GP component 608, which can be on the proportional path, can apply a first gain to the output of the phase step component 606 to produce (e.g., generate) a first gained output, which can be output from the GP component 608 to the input of the summing component 614. In some embodiments, the output of the GP component 608 can comprise 24 bits signed, however, in other embodiments, a different desired number of bits can be utilized.

The GI component 610, which can be on the integral path, can apply a second gain to the output of the phase step component 606 to produce (e.g., generate) a second gain output, which can be output from the GI component 610 to the input of the accumulator component 612. The accumulator component 612 can accumulate the signals input to the accumulator component 612, in accordance with a desired function or equation, such as more fully described herein. In certain embodiments, the output, a(n), of the accumulator component 612 can comprise 24 bits signed, although, in other embodiments, a different desired number of bits can be utilized for the digital PLL component 600. The output of the accumulator component 612 can be input to the summing component 614. In some embodiments, the output, a(n), of the accumulator component 612 can be determined (e.g., calculated), for example, using Eq. (11) as follows:

$$a(n)=\Delta P_{in}(n)*A+a(n-1),\qquad\text{Eq. (11)}$$

wherein $\Delta P_{in}(n)$ can be the difference in the accumulated phase, A can be the gain applied by the GI component 610, and a(n−1) can be the value at the output of the accumulator component 612 from the previous cycle. Also, the value for $\delta f(n)$ can be determined, for example, using Eq. (12):

$$\delta f(n)=\Delta P_{in}(n)*B+a(n),\qquad\text{Eq. (12)}$$

wherein $\Delta P_{in}(n)$ can be the difference in the accumulated phase, B can be the gain applied by the GP component 608, and a(n) can be the value at the output of the accumulator component 612 for the current cycle.

The summing component 614 can sum the output of the GP component 608 and the output of the accumulator component 612 to generate a summed output, which can be or can represent the frequency offset, δf(n). In some embodiments, the summed output can comprise 25 bits signed, however, in other embodiments, a different desired number of bits can be utilized. The summed output of the summing component 614 can be transmitted to the input of the free run control component 616.

The free run control component 616 can enable the frequency offset to be configured to a desired fixed value (e.g., a fixed offset value), rather than be controlled by the loop of the digital PLL component 600, as more fully described herein. In some embodiments, the free run control component 616 can be or can comprise a multiplexer. For example, when the free run control component 616 is or comprises a multiplexer, one input to the free run control component 616 can be summed output of the summing component 614 and another input to the multiplexer can be the desired fixed offset value.

The output of the free run control component 616 can be transmitted to the input of the generator component 618. The generator component 618 can generate output phase information (e.g., an increment request, a decrement request, or a no change request), $\delta P_{out}(n)$, based at least in part on the information (e.g., frequency offset or fixed frequency offset) received from the free run control component 616. In some embodiments, the output phase information can comprise 2 bits signed, although, in other embodiments, a different desired number of bits can be utilized. The digital PLL component 600 can communicate the output phase information to a phase interpolator associated with a transmitter in another part of the device and/or to another phase interpolator(s) associated with another component(s) in another part(s) of the device. As disclosed, the output phase information also can be transmitted via the feedback path 622 to the scale component 620, which can scale the output phase information (if any scaling is to be performed) to produce a scaled version of the output phase information ($\delta P_{out\_scaled}(n)$), as more fully described herein. If no scaling is performed on the output phase information by the scale component 620, $\delta P_{out\_scaled}(n)$ can equal $\delta \phi_{out}(n)$.

In some embodiments, the digital PLL component 600 can employ the following non-limiting specifications:
a system clock associated with the digital PLL component 600 can be running at approximately 830.1 MHz,
a bandwidth of approximately 250 kHz can be utilized by the digital PLL component 600,
the gains (e.g., first gain and/or second gain) can be $2^N$, wherein the first gain and second gain can have respective N values (e.g., first gain (also referred to as GP)=$2^{NP}$, second gain (also referred to as GI)=$2^{NI}$), wherein N can be an integer, so, as a result, the gains can be implemented through a bit-shift,
a tracking range of −400 to +400 ppm can be utilized by the digital PLL component 600,
the offset frequency for the digital PLL component 600 can be determined according to the target clock, which can be 26.5625 GHz,
each increment or decrement step can be 1/32 UI of the target clock, and the step rate can be 400e-6*26.5625e9*32=340e6 steps per second or approximately 1 step every 830/340=2.44 cycles.

It is to be appreciated and understood that these specifications are non-limiting example values, and, in other embodiments, the digital PLL component 600 can utilize different specifications.

The input to the filter, $\delta P_{in}(n)$, can be the input phase information, such as increment or decrement (or no change) requests, received from the CDR unit (e.g., the CDR unit associated with the receiver clock recovery phase interpolator) associated with the receiver of the device. In some embodiments, the input phase information can be represented by a 5-bit signed integer with a range from −8 to +8, wherein a positive value can indicate net increments, zero can mean no change, and a negative number can indicate net decrements. The output of the filter, $\delta P_{out}(n)$, can be the output phase information, such as an increment or a decrement (or no change) request, being communicated to a phase interpolator (e.g., transmitter phase interpolator) associated with the transmitter of the device and/or another phase interpolator(s) associated with another component(s) of the device. The output phase information can be represented by a 2-bit signed integer with values −1 (for decrement), 0 (for no change), +1 (for an increment). The difference in the accumulated phase, $\Delta P_{in}(n)$, due to the increment or decrement (or no change) requests can be accomplished by subtracting $\delta P_{out\_scaled}(n)$ from $\delta P_{in}(n)$, and updating the accumulator component 602 with the resulting difference.

In some embodiments, the signal (e.g., difference in accumulated phase) output from the accumulator component 602 can be processed by the parallel proportional and integral paths of the digital PLL component 600. The proportional path can provide a gain GP (e.g., a first gain) to the signal without filtering and can set the loop bandwidth (fb). The integral path can act as an integrator by using the accumulator component 612 to add the input value (e.g., the signal) to the current output value. The GI component 610 can apply the integral path gain GI (e.g., second gain), which can set the damping factor of the loop. In certain embodiments, the GP can be equal to $2^{NP}$, wherein NP can be configurable to a desired value, wherein one example NP value can be 15 to achieve a bandwidth of approximately 250 kHz. In some embodiments, the integral path gain GI can be equal to $2^{NI}$, wherein NI can be configurable to a desired value, and wherein one example NI value of 2 can provide a damping factor, ζ, of 2. The output of the integral and proportional paths can be a 24-bit signed integer and the output of each path can be saturated at the limits of the signed integer $\{-2^{23}, +2^{23}-1\}$. The summing component 614 can sum the respective signals of the integral and proportional paths together to form a 25-bit signed integer with the limits of the signed integer $\{-2^{24}, +2^{24}-1\}$.

The output of the integral/proportional filter, δf(n), can provide a frequency offset control for generator component 618. The generator component 618 can generate the increment and decrement requests (or no change requests) by updating a 24-bit roll-over accumulator on each cycle by the δf(n). For each overflow of the accumulator component, an increment (+1) can be generated by the generator component 618, and, on each underflow of the accumulator component, a decrement (−1) can be generated by the generator component 618.

As a non-limiting example of bandwidth and damping factors of a closed-loop response of the digital PLL component 600, TABLE 1 presents certain bandwidth and damping factors of a closed-loop response of the digital PLL component 600 with an update frequency of 830.1 MHz for desired (e.g., supported) gain permutations.

TABLE 1

Bandwidth and damping factor for certain gain permutations

| $f_s$ (MHz) | NP | GP = 2^NP | NI | GI = 2^NI | N | fb (kHz) | f2 (kHz) | $\zeta$ |
|---|---|---|---|---|---|---|---|---|
| 830.1 | 14 | 16384 | 0 | 1 | 24 | 129.0 | 8.06 | 2.000 |
| 830.1 | 14 | 16384 | 2 | 4 | 24 | 129.0 | 32.25 | 1.000 |
| 830.1 | 15 | 32768 | 0 | 1 | 24 | 258.0 | 4.03 | 4.000 |
| 830.1 | 15 | 32768 | 2 | 4 | 24 | 258.0 | 16.13 | 2.000 |
| 830.1 | 15 | 32768 | 4 | 16 | 24 | 258.0 | 64.51 | 1.000 |
| 830.1 | 16 | 65536 | 2 | 4 | 24 | 516.1 | 8.06 | 4.000 |
| 830.1 | 16 | 65536 | 4 | 16 | 24 | 516.1 | 32.25 | 2.000 |
| 830.1 | 16 | 65536 | 6 | 64 | 24 | 516.1 | 129.02 | 1.000 |
| 830.1 | 17 | 131072 | 4 | 16 | 24 | 1032.1 | 16.13 | 4.000 |
| 830.1 | 17 | 131072 | 6 | 64 | 24 | 1032.1 | 64.51 | 2.000 |
| 830.1 | 17 | 131072 | 8 | 256 | 24 | 1032.1 | 258.04 | 1.000 |
| 830.1 | 18 | 262144 | 6 | 64 | 24 | 2064.3 | 32.25 | 4.000 |
| 830.1 | 18 | 262144 | 8 | 256 | 24 | 2064.3 | 129.02 | 2.000 |
| 830.1 | 19 | 524288 | 8 | 256 | 24 | 4128.6 | 64.51 | 4.000 |

The specified ranges for NP can allow for a loop bandwidth that can range from 129 kHz to 4.13 MHz. For each NP setting, there can be at least one NI setting that can provide a desired damping factor within a desired range of damping factors (e.g., one or more NI settings that can provide a damping factor within a range of 1 to 4 inclusive). It is to be appreciated and understood that the above example bandwidth and damping factors and associated variables are merely some of the example values that can be utilized, in accordance with the disclosed subject matter. In other embodiments, different bandwidths, damping factors, or other variables can be employed by the disclosed subject matter, and all such different bandwidths, damping factors, or other variables are to be considered part of the disclosed subject matter.

The disclosed subject matter also can provide for a number of desirable control points to control a digital PLL component, such as, for example, digital PLL component 600. In some embodiments, the digital PLL component 600 can employ the holdover component 604 that can provide a holdover state by forcing the ΔP(n) node (e.g., the ΔP$_{in}$(n) node) to a defined value, such as, for example, a 0 value. With the ΔP(n) node set to zero, the proportional gain path can provide a zero output, and the integral path can halt at or maintain the last update value of the integral path. With the holdover state asserted by the holdover component 604, the frequency offset δf(n) can therefore remain where it was when the holdover state was asserted. The holdover can be desirably implemented in the digital PLL component 600, for example, by replacing ΔP(n) with the value 0. However, in order to desirably recover in a clean way, in some embodiments, the accumulator component 602 (e.g., phase accumulator) can be reset to zero. For instance, to desirably create a holdover, the value of the accumulator component 602 can be reset to and held at a zero value, wherein when the holdover is released, the accumulator component 602 can start from zero and does not create a transient. Both can be accomplished though, for example, by resetting the accumulator component 602 while the holdover is asserted. Thus, while the digital PLL component 600 includes a holdover component 604, the digital PLL component 600 can be employed without including the holdover component 604 (e.g., with a 0 value as one input and ΔP(n) as the other input of the holdover component 604), as desired.

In accordance with some embodiments, the holdover component 604 can assert the holdover state either by forcing the holdover state through register control or by assertion in response to a set of alarm signals. To avoid undesirable assertion of the holdover state, the digital PLL component 600 can be configured to provide respective inhibit signals for each of the alarm contributors to respectively inhibit undesirable assertion of the holdover state by the holdover component 604 of the digital PLL component 600.

In certain embodiments, the forced holdover mode of the digital PLL component 600 can be achieved by resetting the accumulator component 602 to a zero value. Such a reset can be useful, helpful, or beneficial, for example, at start-up of the digital PLL component 600 or associated device, recovery from a holdover state, or when the free run mode of the digital PLL component 600 is released.

As disclosed, in some embodiments, the digital PLL component 600 can employ a phase step component 606 that can facilitate performing phase step control for the digital PLL component 600. The phase step component 606 can offset the phase difference node by adding a phase step value. The phase step value can be provided by a configurable register of or associated with the phase step component 606, wherein the configurable register can be set to a desired phase step value. As an example, the configurable register can be a 7-bit field representing a signed integer with range from −64 to +63, with a default value of 0. The output of the configurable register can saturate at the same range as for the output (e.g., 8 bits signed) of the accumulator component 602 (e.g., phase accumulator). This phase step control provided by the phase step component 606 can be used for any of the following:

- to cause the phase of the transmit clock to advance or retreat by the phase step value, wherein this can be helpful or useful to control the skew between different synchronous outputs,
- to cause a phase step for testing the transient response of the control loop of the digital PLL component 600, and/or
- to modulate (via software (SW)/firmware (FW) control) the phase error to test the loop frequency response; wherein, for instance, the configurable register of or associated with the phase step component 606 can be controlled to emulate a sine or square wave phase modulation, wherein the rate can be limited by the register access time.

As disclosed, in some embodiments, the digital PLL component 600 can employ a free run control component 616 that can assert or implement a free run state that can enable the frequency offset to be configured to a desired fixed value (e.g., a fixed offset value), rather than be controlled by the loop of the digital PLL component 600. A configurable 25-bit register, for example, which can be set to the desired fixed value, can be used in place of the output from the proportional-integral filter as an input to the generator component 618. The free run mode of the free run control component 616 can be enabled and disabled by another configuration bit of the digital PLL component 600.

In accordance with various embodiments, the digital PLL component 600 can provide for a number of monitor points to monitor various parts and/or values of the digital PLL component 600. For instance, the digital PLL component 600 can comprise or be associated with a phase input monitor component 624 (PIM) that can monitor the quality of the phase input on the δP$_{in}$(n) node of the digital PLL component 600. The phase input monitor component 624 can accomplish the monitoring the quality of the phase input on the $\delta P_{in}(n)$ node, for example, by creating a histogram by updating a set of counters based at least in part on the $\delta P_n(n)$ value. For instance, the phase input monitor component 624 can comprise or implement a desired number (e.g., 9 or other desired number) of bin counters to count values in each of the following ranges (e.g., following 9 ranges): {−8, . . . , −4}, {−3}, {−2}, {−1}, {0}, {1}, {2}, {3}, {4 . . . 7). The range for each bin counter can be configurable to create a histogram centered around a different value.

In certain embodiments, the digital PLL component 600 can comprise or be associated with a phase difference monitor component 626 (PDM) that can monitor the quality of the phase tracking (e.g., monitor the tracking error) on the $\Delta P(n)$ node. The phase difference monitor component 626 can accomplish such monitoring of the quality of the phase tracking, for example, by creating a histogram by updating a set of counters based at least in part on the $\Delta P(n)$ value, in a manner that can be similar to that as described for phase input monitor component 624, but with appropriate fixed or configurable ranges for each of the counters of the phase difference monitor component 626.

In other embodiments, the digital PLL component 600 can comprise or be associated with a frequency offset monitor component 628 (FOM) that can monitor the frequency offset control $\delta f(n)$ that can be input to the generator component 618. The frequency offset of the recovered clock relative to the reference clock can be determined by monitoring the frequency offset control input $\delta f(n)$. Assuming the update clock is equal to the output frequency $f_{out}$ divided by 32, the fractional frequency offset, $$\frac{\Delta f_{out}}{f_{out}},$$

can be determined as follows in Eq. (13):

$$\frac{\Delta f_{out}}{f_{out}} = \left(\frac{f_{out}}{32}\right)*\delta f(n)/2^{24}/32/f_{out} = \delta f(n)*2^{-34}, \quad \text{Eq. (13)}$$

For a 200 ppm offset, it can be expected for $\delta f(n)$ to be relatively close to $200\text{E-}6*2^{34}=3435974$.

The frequency offset monitor component 628, based at least in part on the monitoring of the frequency offset control input $\delta f(n)$, can determine one or more of the following values: a current $\delta f(n)$ value, no filtering; a maximum $\delta f(n)$ value since last read; a minimum $\delta f(n)$ value since last read; and/or an average $\delta f(n)$ value. Also, based at least in part on the monitoring of the frequency offset control input $\delta f(n)$, the frequency offset monitor component 628 or another component (e.g., employing a SW application programming interface (API)), which regularly reads the current or average $\delta f(n)$ values, can determine or maintain various other statistics or parameters, wherein some non-limiting example parameters can include: a histogram, a standard deviation or variance, or a mean value for the frequency offset control input.

The frequency offset monitor component 628 or other component (e.g., a hardware (HW) and/or SW component) can determine the average $\delta f(n)$ values in a number of ways. In one non-limiting example, the frequency offset monitor component 628 or other component can maintain a running average of $\delta f(n)$ values. In some embodiments, this essentially can comprise a digital infinite impulse response (IIR) filter with the characteristics in Eq. (14) below, wherein M can be a large integer, x(n) can be the current value to be filtered and y(n) can be the filtered value. To implement this efficiently, M can be set to a value $2^N$, and Eq. (14) can be rearranged as shown in Eq. (15) below such that multiplication and division operations can be accomplished with an N-bit shift. Note that x(n) also can be scaled by M in order to prevent loss of precision; and in order to obtain the actual value of the average of x(n), y(n) can be scaled by 1/M. The frequency response can be determined (e.g., by the frequency offset monitor component 628 or other component) using the z-transform as shown in Eq. (16) below. The frequency response of this filter can approximate a first-order low-pass filter with a 3 decibel (dB) bandwidth of 1 MHz when N is be set to 7 (M is 128). It is noted that the bandwidth can scale linearly with M. A potential drawback of this filter can be that the current value can be influenced by a long indeterminate history. Eqs. (14), (15), and (16) can be as follows:

$$y(n)=(y(n-1)*(M-1)+x(n))/M, \quad \text{Eq. (14)}$$

$$y(n)=(y(n-1)*2^N-y(n-1)+x(n))/M, \quad \text{Eq. (15)}$$

$$G(z)=Y(z)/X(z)=1/(M+(1-M)\cdot z^{-1}). \quad \text{Eq. (16)}$$

In another non-limiting example, the frequency offset monitor component 628 or other component can maintain a window average of $\delta f(n)$ values. The frequency offset monitor component 628 or other component can determine or obtain the window average of $\delta f(n)$ values by retaining the sum of x(n) over a window of M updates then dividing by M. To implement this efficiently, M may be set to a value $2^N$ so that the division operation can be accomplished with an N-bit shift. This effectively can be subsampled (e.g., sampled once every M updates), effectively implementing an M-tap finite impulse response (FIR) filter with uniform taps values. The frequency response of the window filter can be determined using the z-transform as shown in Eq. (18) below, which can be derived from Eq. (17) below. The frequency response of this filter can approximate a first-order low-pass filter with a 3 dB bandwidth near 1.44 MHz when M is set to $2^8$. It is noted that the bandwidth can scale linearly with the value of M. Eqs. (17) and (18) can be as follows:

$$y(n) = \frac{1}{M}\sum_{i=n-M+1}^{n} x(n), \quad \text{Eq. (17)}$$

$$Y(z) = \frac{1}{M}\sum_{i=0}^{M-1} X(z)*z^{n-i}, \quad \text{Eq. (18)}$$

The disclosed subject matter also can be employed to monitor the quality of the recovered clock (e.g., from the receiver) at the input of the digital PLL component and the generated clock at the output of the digital PLL component (e.g., digital PLL component 600) by monitoring the effect of the increment/decrement updates on a digital (e.g., virtual) PLL component with target bandwidth. This can be accomplished by applying a high pass filter to the accumulated phase of the digital PLL component. For instance, the target PLL component may have a minimum clock and data recovery (CDR) tracking bandwidth of 4 MHz. The tracking error can be emulated in such a CDR using an accumulator component to convert the increments and decrements into a phase value and applying a high-pass function to the phase value. The high-pass can be of second order so that when there is frequency offset, the monitored value can have a long-term average of 0.

Some non-limiting options for implementing such a filter can include, for example, a digital filter and the digital PLL component (e.g., digital PLL component 600), as described above. With regard to a digital filter, a digital filter equation to emulate a virtual PLL with bandwidth of 4 MHz (K=2*π*4 MHz) with a damping factor ζ of 2 ($\omega_2$=K/16) can look like the following in Eq. (19):

$$G(z) = \frac{a_0 + a_1 z^{-1} + a_2 z^{-2}}{b_0 + b_1 z^{-1} + b_2 z^{-2} + b_3 z^{-3}}, \quad \text{Eq. (19)}$$

wherein: $a_i$ can be {0.9851, −1.9701, 0.9851}, and $b_i$ can be {1.0000, 2.9701, 2.9403, −0.9702}. It is noted that a filter with these coefficients potentially can involve large integer multiplications or some other relatively sophisticated way to implement these gain factors.

Alternatively, the disclosed subject matter can use the PI controller (e.g., digital PLL component 600) as a monitor block. The PI controller (e.g., digital PLL component 600) can accurately emulate the behavior of a PLL since it can be explicitly designed to emulate a PLL. The bandwidth for the PI controller can be tuned to be at or near to the bandwidth of a target PLL. Gain settings (e.g., gain settings for the proportional and integral paths) for the PI controller can be configured appropriately. The tap point for phase tracking error can be, for example, the $\Delta P_{in}(n)$ node.

In some embodiments, the disclosed subject matter can employ the PI controller (e.g., digital PLL component 600) to monitor the quality of the phase output, $\delta P_{out}(n)$, which can be performed in the same or similar way as for $\delta P_{in}(n)$. For example, such monitoring of the quality of the phase output, $\delta P_{out}(n)$, can be performed, for example, by creating a histogram by updating a set of counters based at least in part on the $\delta P_{out}(n)$ value, in a manner that can be similar to that as described for phase input monitor component 624, but with appropriate fixed or configurable ranges for each of the counters utilized to monitor the quality of the phase output.

Frequency-domain modeling of the digital PLL component (e.g., digital PLL component 600) can illustrate certain aspects of the disclosed subject matter. The digital PLL component (e.g., digital PLL component 600), as disclosed herein, can be analyzed using digital signal analysis using z-transforms. The disclosed subject matter can analyze the responses of each of the elements of the loop of the digital PLL and analyze the open loop and closed-loop responses of the digital PLL.

The proportional-integral filter of the digital PLL component (e.g., digital PLL component 600) can desirably emulate the analog PLL compensation filter shown in FIG. 2 and illustrated in mathematical form in Eq. 20 as follows:

$$G_h(s) = K_h \cdot \frac{(\omega_2 + s)}{s} = \frac{K_h \cdot \omega_2}{s} + K_h. \quad \text{Eq. (20)}$$

The Laplace-domain equation $G_h(S)$ can be converted to a z-domain equation $G_h(Z)$ using a bilinear transformation, substituting s as shown in Eq. (21) below, resulting in Eq. (22) as follows:

$$s \leftarrow C \cdot \frac{1-z^{-1}}{1+z^{-1}} \cong 2 \cdot f_s \cdot \frac{1-z^{-1}}{1+z^{-1}}, \quad \text{Eq. (21)}$$

$$G_h(z) = \frac{K_h \cdot \omega_2}{2 \cdot f_s} \frac{1+z^{-1}}{1-z^{-1}} + K_h. \quad \text{Eq. (22)}$$

Figure 7:
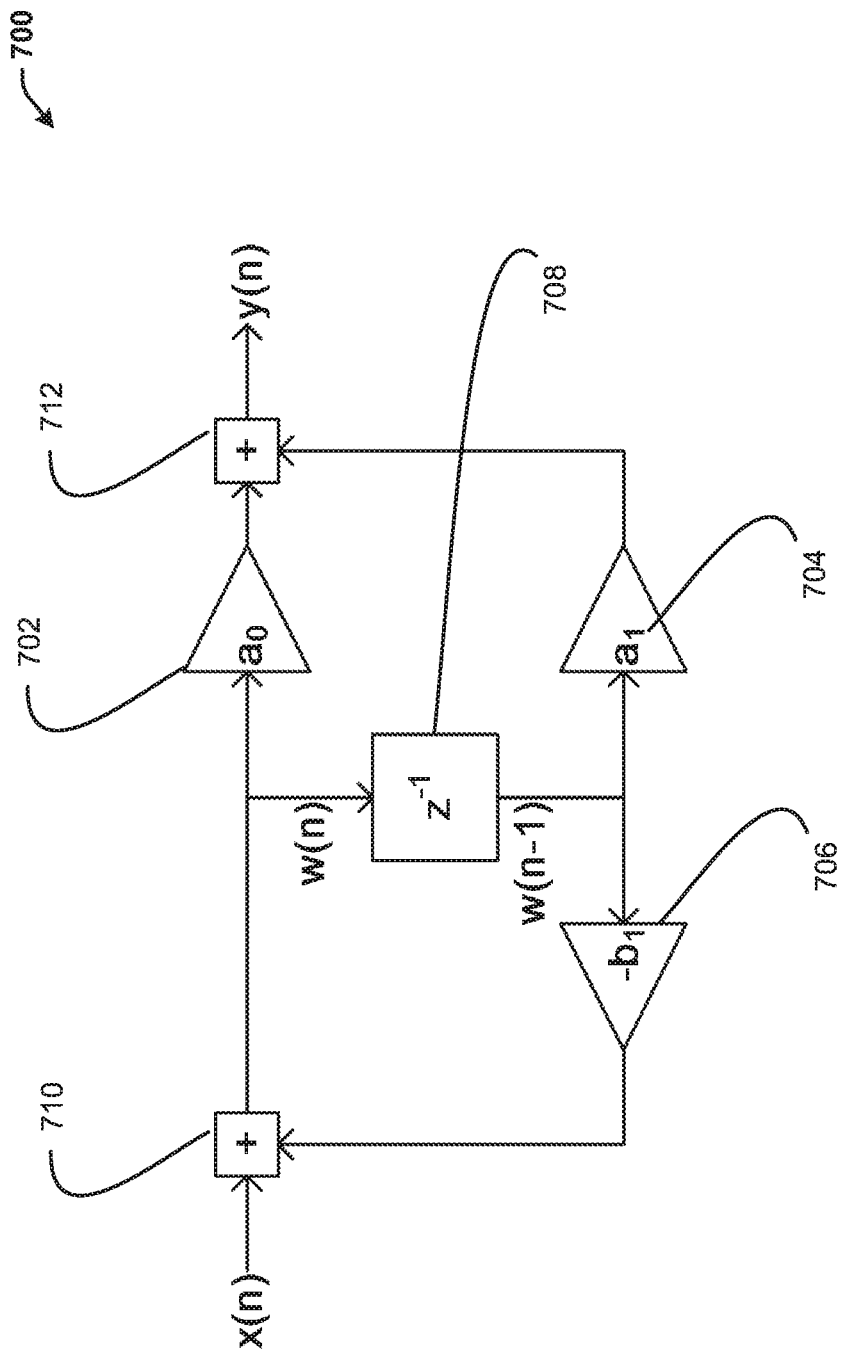
FIG. 7 presents a block diagram of a first-order digital filter component, in accordance with aspects and embodiments of the disclosed subject matter.

An equation of the form in Eq. (23) as follows:

$$G(z) = \frac{a_0 + a_1 z^{-1}}{b_0 + b_1 z^{-1}}, \quad \text{Eq., (23)}$$

wherein $b_0$ is equal to 1 can be implemented as shown in FIG. 7, which presents a block diagram of a first-order direct form digital filter component 700, in accordance with aspects and embodiments of the disclosed subject matter.

The digital filter component 700 can comprise $a_o$ block 702, $a_1$ block 704, $-b_1$ block 706, $z^{-1}$ block 708, summing block 710, and summing block 712, which can be arranged in relation to and/or associated with, each other, as shown in FIG. 7, wherein, for each of the respective summing blocks, a summing block can add the respective values being fed into the summing block to produce a summed output representing the sum of the respective values. It can be noted that if $a_0$ and $a_1$ are equal to 1, with the exception of the first element in the series, the output y(n) can be equal to two times the cumulative sum of x(n). It therefore can be equivalent to (a) replacing $a_o$ with 0 and $a_1$ with $2 \cdot a_1$ or (b) replacing $a_1$ with zero and $a_o$ with $2 \cdot a_0$. $G_h(z)$ can therefore be made less complex, as shown in Eq. (24) or Eq. (25) as follows:

$$G_h(z) \cong \frac{K_h \cdot \omega_2}{2 \cdot f_s} \frac{0 + 2 \cdot z^{-1}}{1-z^{-1}} + K_h = \frac{K_h \cdot \omega_2}{f_s} \frac{z^{-1}}{1-z^{-1}} + K_h, \quad \text{Eq. (24)}$$

or $$G_h(z) \cong \frac{K_h \cdot \omega_2}{2 \cdot f_s} \frac{2 + 0 \cdot z^{-1}}{1-z^{-1}} + K_h = \frac{K_h \cdot \omega_2}{f_s} \frac{1}{1-z^{-1}} + K_h. \quad \text{Eq. (25)}$$

Figure 8:
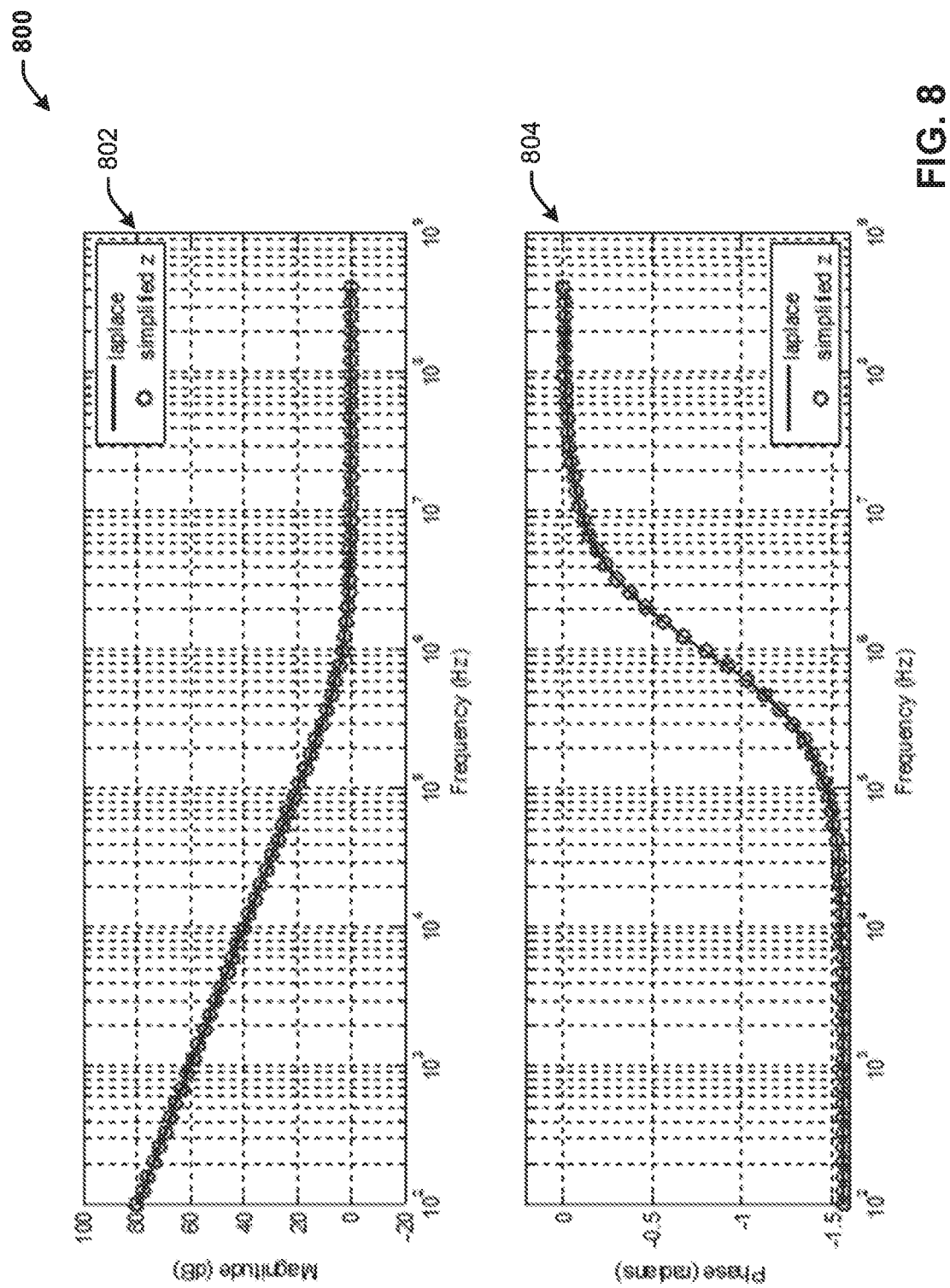
FIG. 8 presents a diagram of an example graph of a compensation filter response, Laplace vs. simplified z-domain, in accordance with aspects and embodiments of the disclosed subject matter.

FIG. 8 presents a diagram of example graphs 800 of the compensation filter response, Laplace vs. simplified z-domain, in accordance with aspects and embodiments of the disclosed subject matter. The graphs 800 can compare the magnitude of the frequency response of the compensation filter (graph 802) and the phase of the frequency response of the compensation filter (graph 804) when designed for $K_h$ of 1, $f_2$ of 1 MHz, and $f_s$ of 830.1 MHz (z-domain only) for the Laplace response (in accordance with Eq. (20)) and the simplified z-domain forms (in accordance with Eq. (24)), wherein the graph 800 can demonstrate that the respective responses of Laplace and the simplified z-domain can be virtually identical to each other.

Figure 9A:
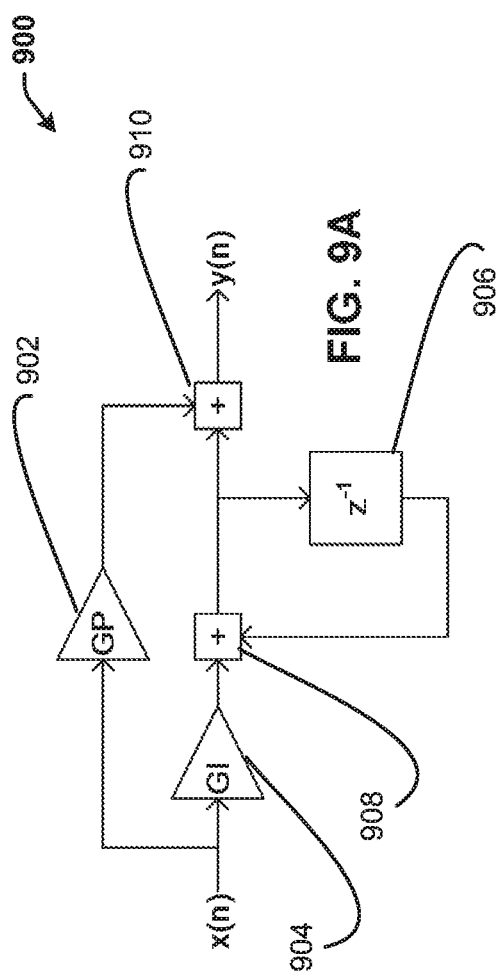
FIG. 9A depicts a block diagram of an example compensation filter having a first form, in accordance with various aspects and embodiments of the disclosed subject matter.
Figure 9B:
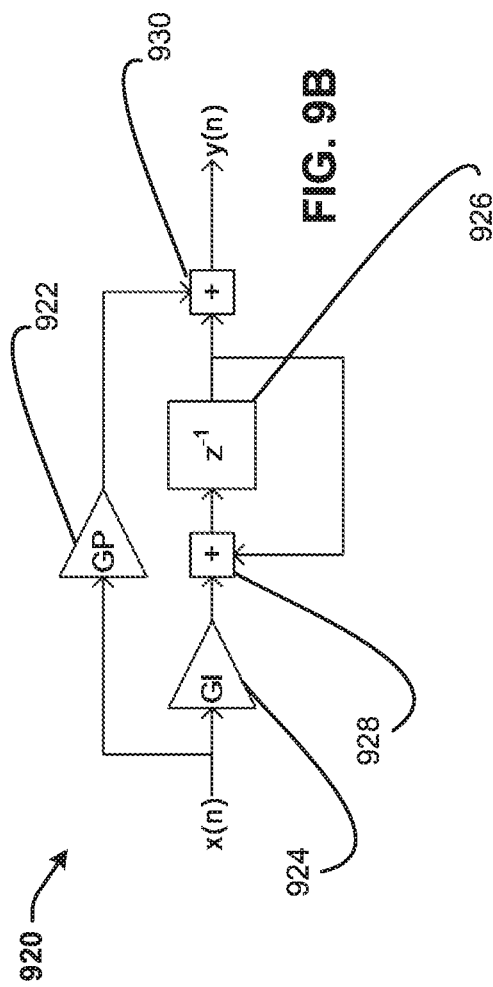
FIG. 9B depicts a block diagram of an example compensation filter having a second form, in accordance with various aspects and embodiments of the disclosed subject matter.

The compensation filter $G_h(f)$ can therefore be implemented in either of the forms shown in FIG. 9A or 9B, with GP equal to $K_h$ and GI equal to $K_h \cdot \omega_2/f_s$. FIG. 9A depicts a block diagram of an example compensation filter 900 having a first form, with GP equal to $K_h$ and GI equal to $K_h \cdot \omega_2/f_s$, and FIG. 9B depicts a block diagram of an example compensation filter 920 having a second form, with GP equal to $K_h$ and GI equal to $K_h \cdot \omega_2/f_s$, in accordance with various aspects and embodiments of the disclosed subject matter.

With regard to FIG. 9A, the compensation filter 900 can comprise a GP component 902 that can be part of the proportional path, and a GI component 904 that can be part of the integral path, of the compensation filter 900. The compensation filter 900 also can comprise a $z^{-1}$ block 906, summing block 908, and summing block 910, wherein the various components 902, 904, 906, 908, and 910 of the compensation filter 900 can be arranged, and respectively associated with each other, as shown in FIG. 9A, and wherein x(n) can be the input to the compensation filter 900 and y(n) can be the output from the compensation filter 900.

With regard to FIG. 9B, the compensation filter 920 can comprise a GP component 922 that can be part of the proportional path, and a GI component 924 that can be part of the integral path, of the compensation filter 920. The compensation filter 920 also can comprise a $z^{-1}$ block 926, summing block 928, and summing block 930, wherein the various components 922, 924, 926, 928, and 930 of the compensation filter 920 can be arranged, and respectively associated with each other, as shown in FIG. 9B, and wherein x(n) can be the input to the compensation filter 920 and y(n) can be the output from the compensation filter 920.

Figure 10:
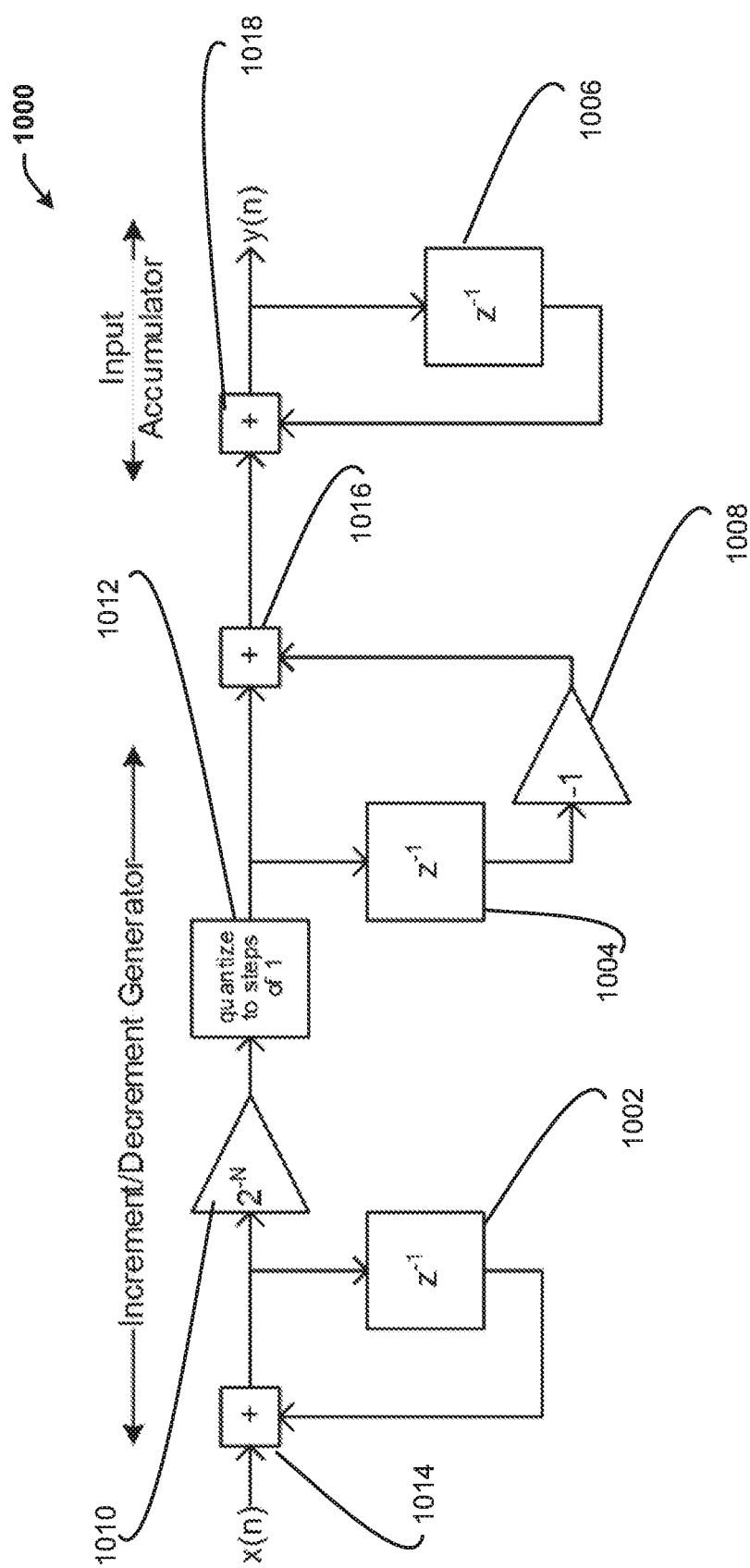
FIG. 10 illustrates a diagram of an increment/decrement generator model, in accordance with various aspects and embodiments of the disclosed subject matter.

With further regard to the digital PLL component (e.g., digital PLL component 600), as disclosed herein, the generator component (e.g., increment/decrement generator) in combination with the accumulator component (e.g., input accumulator component) at the input of the digital PLL component can be modeled as illustrated in FIG. 10, which illustrates a diagram of an increment/decrement generator model 1000, in accordance with various aspects and embodiments of the disclosed subject matter. The increment/decrement generator model 1000 can comprise $z^{-1}$ block 1002, $z^{-1}$ block 1004, $z^{-1}$ block 1006, −1 block 1008, $2^{-N}$ block 1010, quantizer block 1012, summing block 1014, summing block 1016, and summing block 1018, wherein the various components 1002, 1004, 1006, 1008, 1010, 1012, 1014, 1016, and 1018 of the increment/decrement generator model 1000 can be arranged, and respectively associated with each other, as shown in FIG. 10, and wherein x(n) can be the input to the increment/decrement generator model 1000 and y(n) can be the output from the increment/decrement generator model 1000.

The effect of the modulus divider can be represented by the accumulator $G_1(z)$, wherein $G_1(z)=1/(1-z^{-1})$, and wherein $G_1(z) \approx f_s/s$. The conversion to increments and decrements can be accomplished by normalizing the N-bit counter, quantizing to steps of 1 (e.g., by the quantizer block 1312), and differentiating $G_2(z)$ and dividing by 32 to represent one step of 1/32 UI, wherein $G_2(z)=1-z^{-1}$. The effect of the input accumulator also can be modeled by $G_3(z)$, wherein $G_3(z)=1/(1-z^{-1})$. It is noted that the effect of the output differentiation $G_2(z)$ and the input accumulator $G_3(z)$ can cancel each other out. Accordingly, the resulting net equation can be given by Eq. (26) and Eq. (27) as follows:

$$G_o(z) = \frac{2^{-N}}{1-z^{-1}}, \quad \text{Eq. (26)}$$

and $$G_o(s) \cong \frac{f_s \cdot 2^{-N}}{s}. \quad \text{Eq. (27)}$$

The combined gain of increment/decrement generator $K_0$ can therefore be $f_s \cdot 2^{-N}$.

The open loop response can be given by Eq. (27) and Eq. (28), and the loop gain K in radians per second can be given by Eq. (29), as follows:

$$G_{loop}(z) = G_f(z) \cdot G_o(z) = \frac{2^{-N}}{1-z^{-1}} \cdot \left( \frac{K_h \cdot \omega_2}{f_s} \frac{1}{1-z^{-1}} + K_h \right), \quad \text{Eq. (27)}$$

$$G_o(s) \cong \frac{f_s \cdot 2^{-N}}{s} \cdot \left( \frac{K_h \cdot \omega_2}{s} + K_h \right), \quad \text{Eq. (28)}$$

and $$K \cong f_s \cdot 2^{-N} \cdot K_h. \quad \text{Eq. (29)}$$

With regard to the closed-loop response, given that the form of the open loop response can match, or at least substantially match, the expected open loop response of an analog PLL, traditional techniques can be used to specify or predict the closed-loop response. The bode bandwidth of the PLL can be given by K as shown in Eq. (29). The damping factor can be a function of K and $\omega_2$, such as described with regard to the compensation filter (e.g., FIGS. 7, 8, 9A, and 9B) of the subject disclosure. In an example implementation of the closed-loop response, the following example parameters can illustrate certain aspects of the closed-loop response:

$$K_h = GP = 2^{15} = 32768;$$

$$GI = 2^2 = 4;$$

$$NG = 24;$$

$$f_s = 830.1 \text{ MHz};$$

$$\text{Loop Bandwidth} = f_b = \frac{K}{(2*\pi)} = 830.1 \text{ MHz} \cdot 2^{-24} \cdot \frac{32768}{(2*\pi)} = 258 \text{ kHz};$$

$$f_2 = \frac{\omega_2}{(2*\pi)} = GI \cdot \frac{f_s}{(K_h \cdot 2 \cdot \pi)} = 1 \cdot 830.1 \text{ MHz}/(32768 \cdot 2 \cdot \pi) = 16.13 \text{ kHz};$$

and $$\text{Damping factor} = \zeta = \frac{\left(\frac{K}{\omega_2}\right)^{\frac{1}{2}}}{2} = \frac{\left(\frac{f_b}{f_2}\right)^{\frac{1}{2}}}{2} = \frac{(258 \text{ kHz}/16.13 \text{ kHz})^{\frac{1}{2}}}{2} = 2.$$

Figure 11:
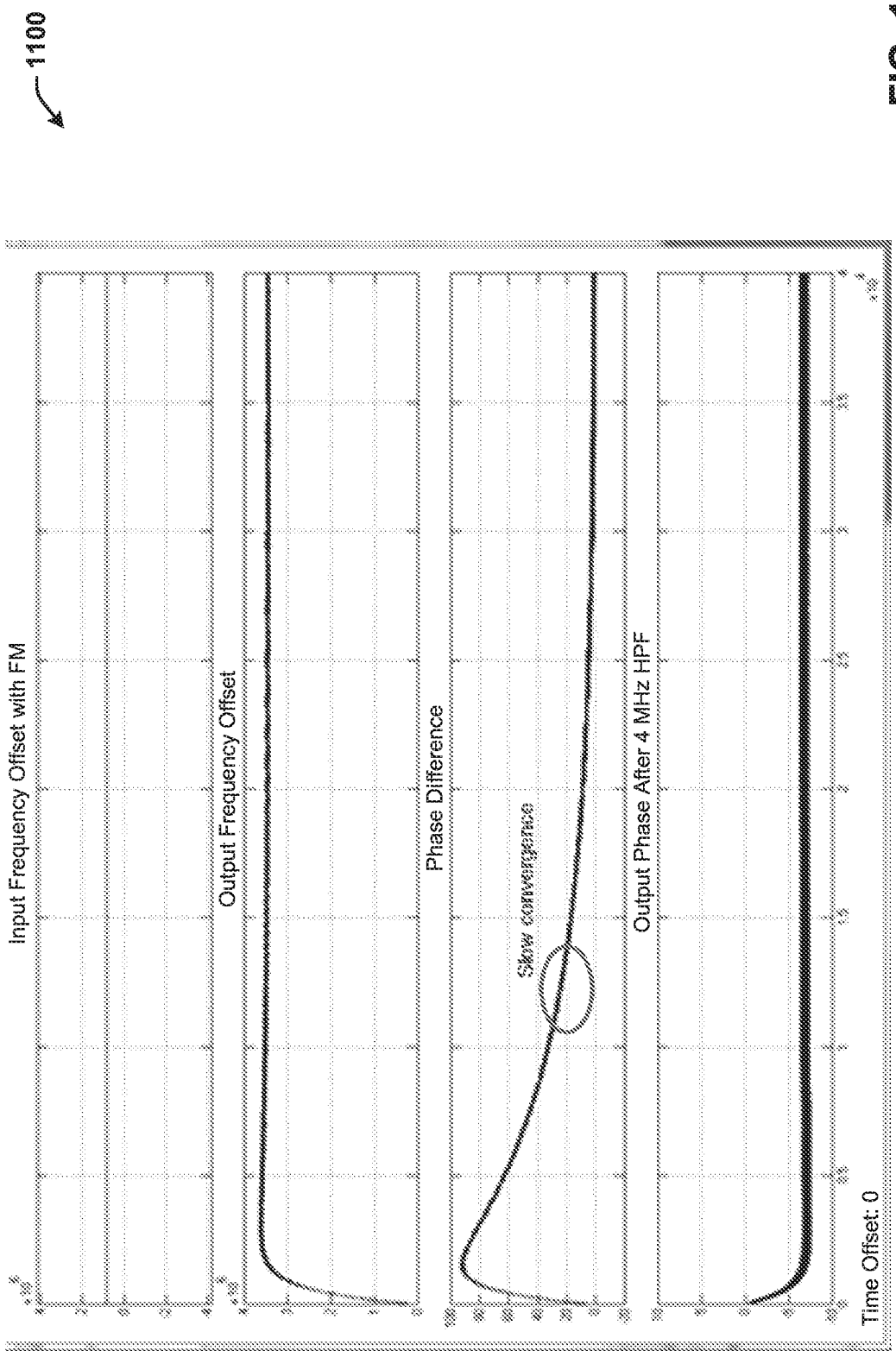
FIG. 11 presents a diagram of an example graph of a closed-loop transient response based on example parameters of an example implementation of a closed-loop response, in accordance with aspects and embodiments of the disclosed subject matter.

FIG. 11 presents a diagram of an example graphs 1100 of closed-loop transient responses based on the example parameters of such example implementation of the closed-loop response, in accordance with aspects and embodiments of the disclosed subject matter.

The aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Figure 12:
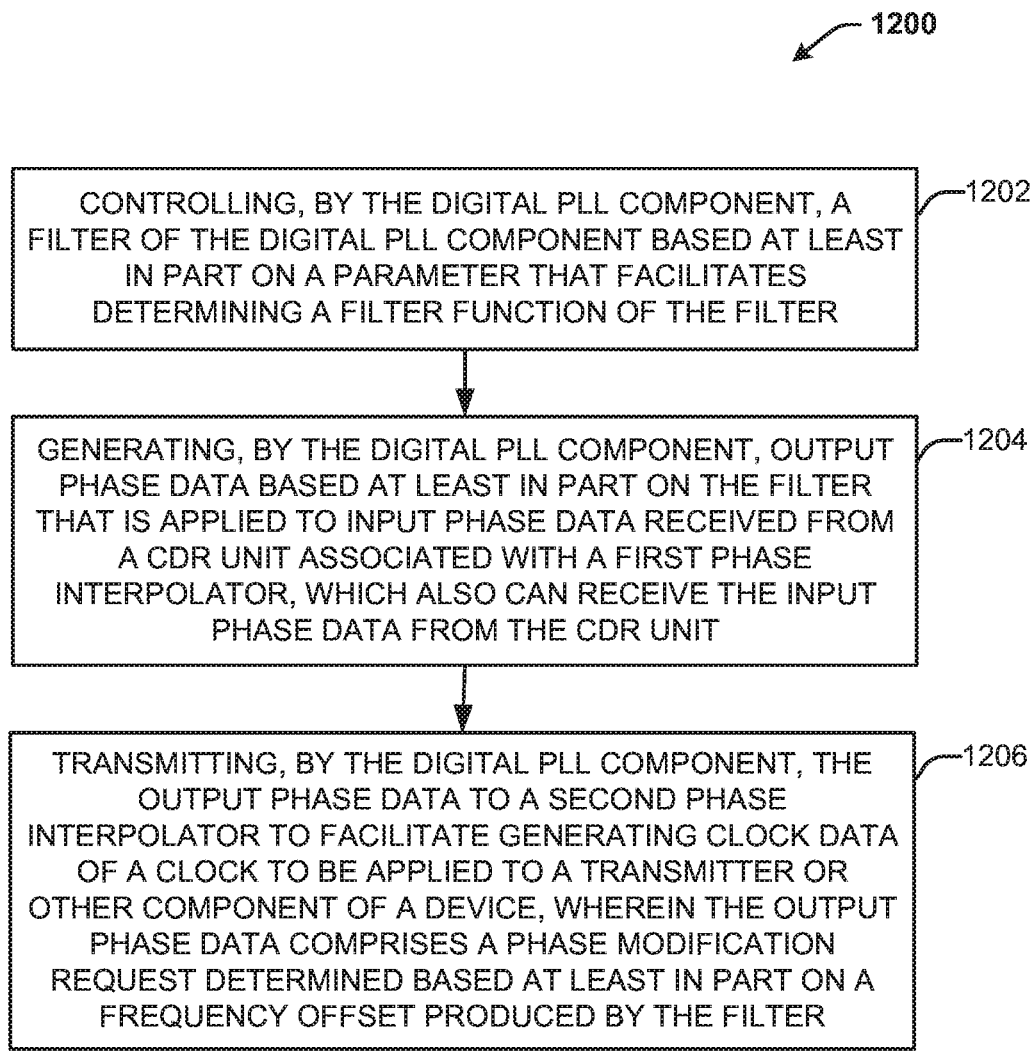
FIG. 12 illustrates a flow chart of an example method that can employ a digital or virtual PLL component to filter phase information for clock signals of a device, in accordance with various aspects and embodiments of the disclosed subject matter.
Figure 13:
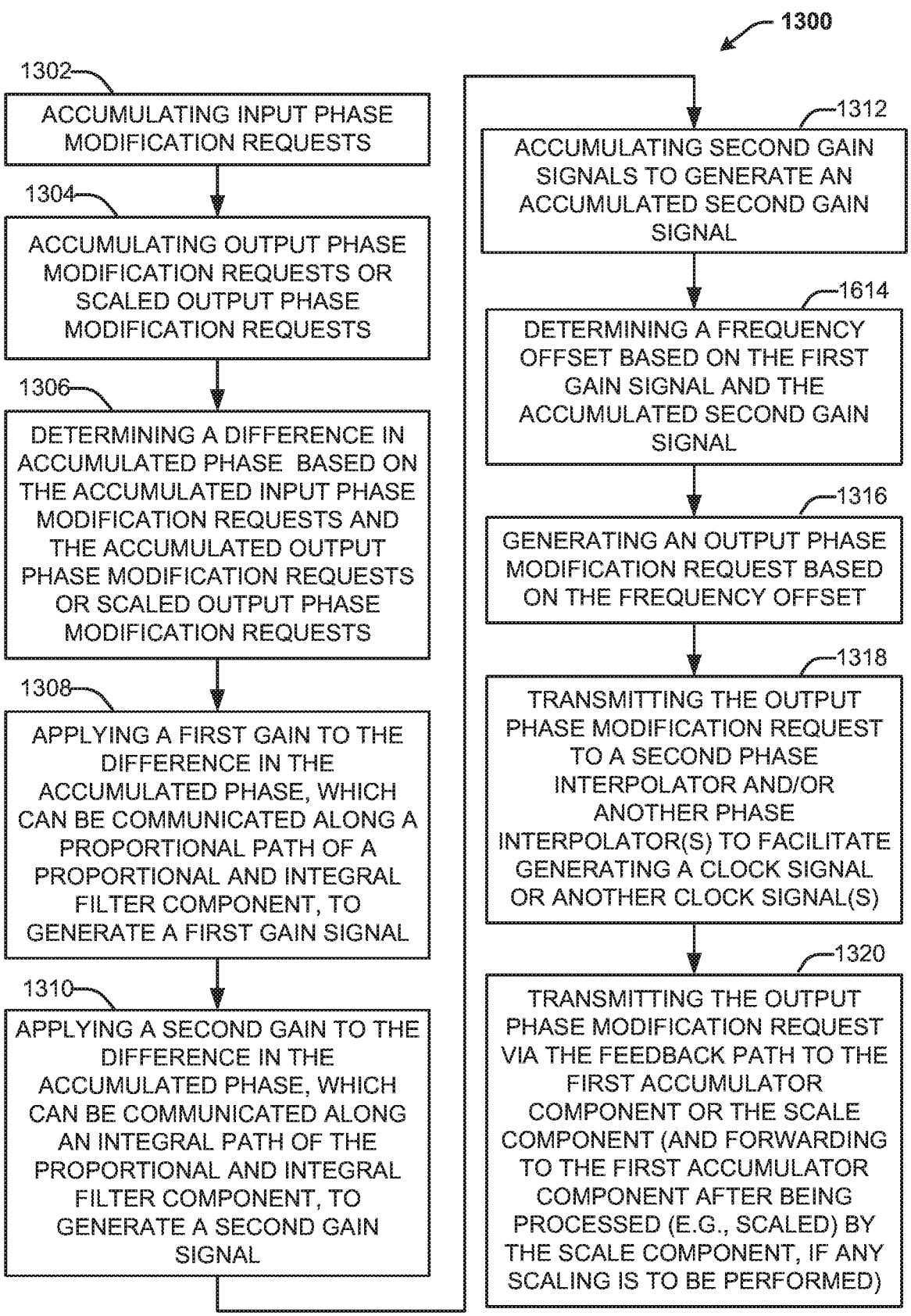
FIG. 13 depicts a flow chart of another example method that can employ a digital or virtual PLL component to filter phase information for clock signals of a device, in accordance with various aspects and embodiments of the disclosed subject matter.
Figure 14:
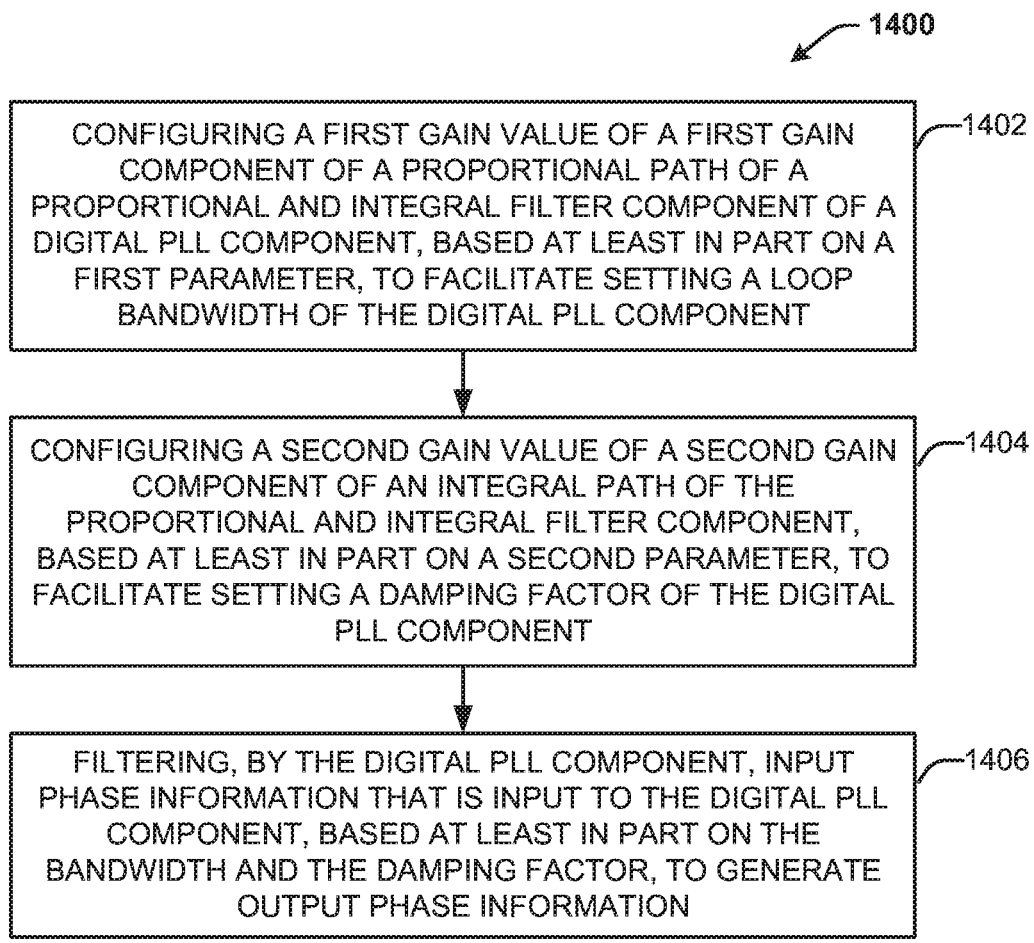
FIG. 14 illustrates a flow chart of an example method for configuring a digital or virtual PLL component to facilitate filtering phase information for clock signals of a device, in accordance with various aspects and embodiments of the disclosed subject matter.

In view of the example systems and/or devices described herein, example methods that can be implemented in accordance with the disclosed subject matter can be further appreciated with reference to flowcharts in FIGS. 12-14. For purposes of simplicity of explanation, example methods disclosed herein are presented and described as a series of acts; however, it is to be understood and appreciated that the disclosed subject matter is not limited by the order of acts, as some acts may occur in different orders and/or concurrently with other acts from that shown and described herein. For example, a method disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a method in accordance with the subject specification. It should be further appreciated that the methods disclosed throughout the subject specification are capable of being stored on an article of manufacture to facilitate transporting and transferring such methods to computers for execution by a processor or for storage in a memory.

FIG. 12 illustrates a flow chart of an example method 1200 that can employ a digital or virtual PLL component to filter phase information for clock signals of a device, in accordance with various aspects and embodiments of the disclosed subject matter. The method 1200 can be employed by, for example, a system comprising the digital or virtual PLL component.

At 1202, a filter of the digital PLL component can be controlled by the digital PLL component based at least in part on a parameter that facilitates determining a filter function of the filter. The digital PLL component is configurable, based at least in part on a set of parameters, comprising the parameter, to structure, configure, and/or control the operation of the filter of the digital PLL component, wherein the parameter can facilitate determining the filter function of the filter.

At 1204, output phase data can be generated by the digital PLL component based at least in part on the filter that is applied to input phase data received from a CDR unit that can be associated with a first phase interpolator, which also can receive the input phase data from the CDR unit. The digital PLL component can receive the input phase data from the CDR unit, which can be part of or associated with a receiver or other component of the device. The input phase data can comprise an input phase modification request (e.g., an increment request, a decrement request, or a no change request) that was generated by and/or received from the CDR unit. The digital PLL component can generate the output phase data based at least in part on the filter applied to the input phase data received from the first phase interpolator. The filter of the digital PLL component can desirably (e.g., suitably, acceptably, or optimally) filter out jitter, phase noise, or other undesirable noise or characteristics of the input phase data. In some embodiments, the output frequency can be scaled up or down, relative to the input frequency to the digital PLL component, by a desired scaling factor, as more fully described herein.

At 1206, the output phase data can be transmitted, by the digital PLL component, to a second phase interpolator to facilitate generating clock data of a clock to be applied to a transmitter or other component of a device, wherein the output phase data comprises a phase modification request determined based at least in part on a frequency offset produced by the filter. The output phase data, which can be a filtered output from the digital PLL component, can be transmitted across the device to the second phase interpolator and/or other phase interpolator(s) of another component(s) of the device. The output phase data can comprise the phase modification request, which can be an increment request, a decrement request, or a no change request, wherein the phase modification request can be determined based at least in part on the frequency offset generated by the digital PLL component.

The second phase interpolator can receive the output phase data. Based at least in part on the output phase data, the second phase interpolator can generate clock data (e.g., clock signals) of the clock to be applied to the transmitter or other component of the device.

FIG. 13 depicts a flow chart of another example method 1300 that can employ a digital or virtual PLL component to filter phase information for clock signals of a device, in accordance with various aspects and embodiments of the disclosed subject matter. The method 1300 can be employed by, for example, a system comprising the digital or virtual PLL component.

At 1302, input phase modification requests can be accumulated. A first accumulator component of the digital PLL component can receive the input phase modification requests from a CDR unit associated with a receiver (or other component) of a device (e.g., communication device), wherein the CDR unit also can be associated with a first phase interpolator, which can receive the input phase modification requests from the CDR unit and can process the input phase modification requests, as more fully described herein. The first accumulator component can accumulate the input phase modification requests.

At 1304, output phase modification requests or scaled output phase modification requests can be accumulated. The first accumulator component can receive the output phase modification requests or scaled output phase modification requests from a feedback path of the digital PLL component that can be associated with the output of a generator component (e.g., increment/decrement generator) of the digital PLL component. The first accumulator component can accumulate the output phase modification requests or scaled output phase modification requests. In some embodiments, the output phase modification requests can be scaled (e.g., using fractional scaling) by a scale component located in the feedback path, to facilitate scaling the input to output frequency up or down by a desired rational factor (e.g., by removing or adding increment requests or decrement requests), to generate the scaled output phase modification requests, as more fully described herein. The output phase modification requests output from the generator component also can be transmitted to a second phase interpolator associated with a transmitter component or another phase interpolator(s) associated with another component(s) of the device, as more fully described herein.

At 1306, a difference in accumulated phase can be determined based at least in part on the accumulated input phase modification requests and the accumulated output phase modification requests or scaled output phase modification requests. The first accumulator component can determine the difference in the accumulated phase (e.g., accumulated phase difference signal), for example, by subtracting the accumulated output phase modification requests or scaled output phase modification requests from the accumulated input phase modification requests.

At 1308, a first gain can be applied to the difference in the accumulated phase, which can be communicated along a proportional path of a proportional and integral filter component of the digital PLL component, to generate a first gain signal. A first gain component (e.g., a GP component), which can be located on the proportional path, can apply the first gain to the difference in the accumulated phase communicated along the proportional path to generate the first gain signal (e.g., proportional gain signal). The first gain can be determined based at least in part on a first parameter, wherein the first parameter (e.g., NP value) can facilitate setting the loop bandwidth of the digital PLL component, as more fully described herein.

At 1310, a second gain can be applied to the difference in the accumulated phase, which can be communicated along an integral path of the proportional and integral filter component, to generate a second gain signal. A second gain component (e.g., a GI component), which can be located on the integral path, can apply the second gain to the difference in the accumulated phase, communicated along the integral path, to generate the second gain signal. The second gain can be determined based at least in part on a second parameter, wherein the second parameter (e.g., NI value) can facilitate setting the damping factor of the digital PLL component, as more fully described herein.

At 1312, second gain signals can be accumulated to generate an accumulated second gain signal. A second accumulator component, which can be located on the integral path, can receive second gain signals output by the second gain component and can accumulate the second gain signals to generate the accumulated second gain signal (e.g., integral gain signal).

At 1314, a frequency offset can be determined based at least in part on the first gain signal and the accumulated second gain signal. The digital PLL component can determine the frequency offset (e.g., frequency offset signal or frequency offset control signal) based at least in part on the first gain signal and the accumulated second gain signal. In some embodiments, the digital PLL component can comprise a summing component that can receive the first gain signal and the accumulated second gain signal from the proportional path and integral path, respectively. The summing component can add the first gain signal to the accumulated second gain signal to generate the frequency offset as an output.

At 1316, an output phase modification request can be generated based at least in part on the frequency offset. The digital PLL component can generate the output phase modification request based at least in part on the frequency offset. For instance, the generator component of the digital PLL component can receive the frequency offset from the summing component. The generator component can determine and generate the output phase modification request based at least in part on the frequency offset, as more fully described herein. The output phase modification request can be, for example, an increment request, a decrement request, or a no change request, as more fully described herein.

At 1318, the output phase modification request can be transmitted to a second phase interpolator and/or another phase interpolator(s) to facilitate generating a clock signal or another clock signal(s). The generator component can transmit the output phase modification request to the second phase interpolator associated with a transmitter component and/or the other phase interpolator(s) associated with another component(s) of the device to facilitate generating the clock signal for the transmitter or the other clock signal(s) for the other component(s).

At 1320, the output phase modification request also can be transmitted via the feedback path of the digital PLL component to the first accumulator component or the scale component (and forwarded to the first accumulator component after being processed (e.g., scaled) by the scale component, if any scaling is to be performed). The digital PLL component also can transmit the output phase modification request via the feedback path to the first accumulator component or to the scale component. If the output phase modification request is transmitted to the scale component in the feedback path, the scale component can process (e.g., scale, for example, using fractional scaling, if any scaling is to be performed) the output phase modification request, and can forward the scaled (or unscaled) output phase modification request to the first accumulator.

FIG. 14 illustrates a flow chart of an example method 1400 for configuring a digital or virtual PLL component to facilitate filtering phase information for clock signals of a device, in accordance with various aspects and embodiments of the disclosed subject matter. The method 1400 can be employed by, for example, a system comprising the digital or virtual PLL component.

At 1402, a first gain value of a first gain component of a proportional path of a proportional and integral filter component of the digital PLL component can be configured, based at least in part on a first parameter, to facilitate setting a loop bandwidth of the digital PLL component. The first gain value (e.g., GP value) of the first gain component (e.g., GP component) of the proportional path can be configured (e.g., automatically configured or configured by a user), based at least in part on the first parameter (e.g., NP value), to facilitate setting the loop bandwidth of the digital PLL component, as more fully described herein. In some embodiments, the first parameter can range from 14 to 19, inclusive, to achieve a bandwidth that can range from approximately 125 kHz to approximately 4 MHz.

At 1404, a second gain value of a second gain component of an integral path of the proportional and integral filter component can be configured, based at least in part on a second parameter, to facilitate setting a damping factor of the digital PLL component. The second gain value (e.g., GI value) of the second gain component (e.g., GI component) of the integral path can be configured (e.g., automatically configured or configured by a user), based at least in part on the second parameter (e.g., NI value), to facilitate setting the damping factor of the digital PLL component, as more fully described herein. In some embodiments, the second parameter can be configurable to be 0, 2, 4, 6, or 8, to achieve a damping factor that can range from 1 to 4, inclusive.

At 1406, input phase information input to the digital PLL component can be filtered by the digital PLL component (e.g., the proportional and integral filter component of the digital PLL component), based at least in part on the bandwidth and the damping factor, to generate output phase information. The digital PLL component, utilizing the proportional and integral filter component as configured based at least in part on the first parameter and the second parameter, can filter the input phase information received from a first phase interpolator associated with a receiver (or other component) of the device, based at least in part on the bandwidth and the damping factor, to generate the output phase information. The output phase information (e.g., increment request, decrement request, or no change request) can be transmitted from the digital PLL component to a second phase interpolator associated with a transmitter component or another phase interpolator(s) associated with another component(s) of the device to facilitate generating a clock signal for the transmitter component or other component(s) based at least in part on the output phase information.

Example Computing Environment

Figure 15:
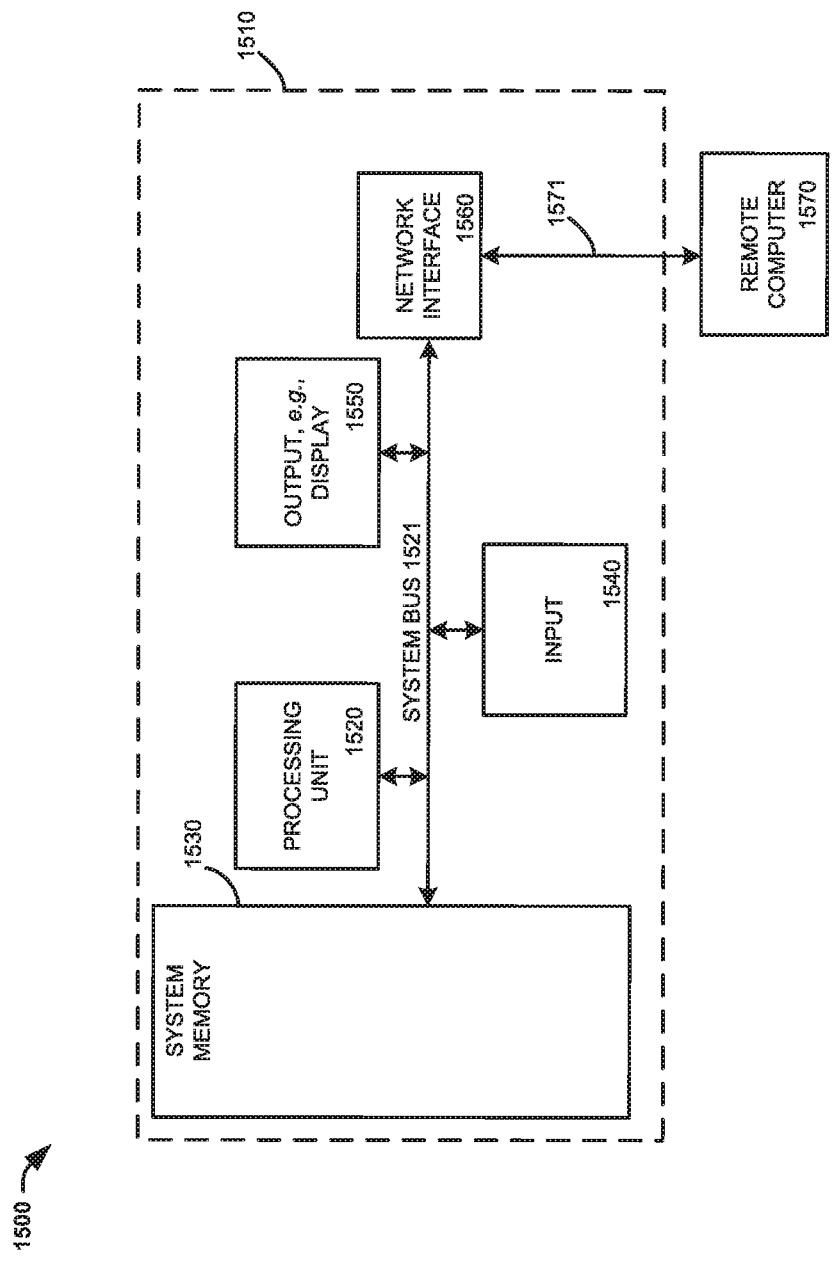
FIG. 15 illustrates a block diagram of an example electronic computing environment that can be implemented in conjunction with one or more aspects described herein.

As mentioned, advantageously, the techniques described herein can be applied to any device and/or network where power management is desirable in a multiprocessor, multi-node system, or fixed, installed systems such as routers, servers, switch, NICs, etc. Further, power consumption can be mitigated and saved on a static or continuous basis. It is to be understood, therefore, that handheld, portable and other computing devices and computing objects of all kinds are contemplated for use in connection with the various non-limiting embodiments, e.g., anywhere that a device may wish to implement power management for a multiprocessor system. Accordingly, the below general purpose remote computer described below in FIG. 15 is but one example, and the disclosed subject matter can be implemented with any client having network/bus interoperability and interaction. Thus, the disclosed subject matter can be implemented in an environment of networked hosted services in which very little or minimal client resources are implicated, e.g., a networked environment in which the client device serves merely as an interface to the network/bus, such as an object placed in an appliance.

Although not required, some aspects of the disclosed subject matter can partly be implemented via an operating system, for use by a developer of services for a device or object, and/or included within application software that operates in connection with the component(s) of the disclosed subject matter. Software may be described in the general context of computer executable instructions, such as program modules or components, being executed by one or more computer(s), such as projection display devices, viewing devices, or other devices. Those skilled in the art will appreciate that the disclosed subject matter may be practiced with other computer system configurations and protocols.

FIG. 15 thus illustrates an example of a suitable computing system environment 1500 in which some aspects of the disclosed subject matter can be implemented, although as made clear above, the computing system environment 1500 is only one example of a suitable computing environment for a device and is not intended to suggest any limitation as to the scope of use or functionality of the disclosed subject matter. Neither should the computing environment 1500 be interpreted as having any dependency or requirement relating to any one or combination of components illustrated in the exemplary operating environment 1500.

With reference to FIG. 15, an exemplary device for implementing the disclosed subject matter includes a general-purpose computing device in the form of a computer 1510. Components of computer 1510 may include, but are not limited to, a processing unit 1520, a system memory 1530, and a system bus 1521 that couples various system components including the system memory to the processing unit 1520. The system bus 1521 may be any of several types of bus structures including a memory bus or memory controller, a peripheral bus, and a local bus using any of a variety of bus architectures.

Computer 1510 typically includes a variety of computer readable media. Computer readable media can be any available media that can be accessed by computer 1510. By way of example, and not limitation, computer readable media can comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 1510. Communication media typically embodies computer readable instructions, data structures, program modules, or other data in a modulated data signal such as a carrier wave or other transport mechanism and includes any information delivery media.

The system memory 1530 may include computer storage media in the form of volatile and/or nonvolatile memory such as read only memory (ROM) and/or random access memory (RAM). A basic input/output system (BIOS), containing the basic routines that help to transfer information between elements within computer 1510, such as during start-up, may be stored in memory 1530. Memory 1530 typically also contains data and/or program modules that are immediately accessible to and/or presently being operated on by processing unit 1520. By way of example, and not limitation, memory 1530 may also include an operating system, application programs, other program modules, and program data.

The computer 1510 may also include other removable/non-removable, volatile/nonvolatile computer storage media. For example, computer 1510 could include a hard disk drive that reads from or writes to non-removable, nonvolatile magnetic media, a magnetic disk drive that reads from or writes to a removable, nonvolatile magnetic disk, and/or an optical disk drive that reads from or writes to a removable, nonvolatile optical disk, such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. A hard disk drive is typically connected to the system bus 1521 through a non-removable memory interface such as an interface, and a magnetic disk drive or optical disk drive is typically connected to the system bus 1521 by a removable memory interface, such as an interface.

A user can enter commands and information into the computer 1510 through input devices such as a keyboard and pointing device, commonly referred to as a mouse, trackball, or touch pad. Other input devices can include a microphone, joystick, game pad, satellite dish, scanner, wireless device keypad, voice commands, or the like. These and other input devices are often connected to the processing unit 1520 through user input 1540 and associated interface(s) that are coupled to the system bus 1521, but may be connected by other interface and bus structures, such as a parallel port, game port, or a universal serial bus (USB). A graphics subsystem can also be connected to the system bus 1521. A projection unit in a projection display device, or a HUD in a viewing device or other type of display device can also be connected to the system bus 1521 via an interface, such as output interface 1550, which may in turn communicate with video memory. In addition to a monitor, computers can also include other peripheral output devices such as speakers which can be connected through output interface 1550.

The computer 1510 can operate in a networked or distributed environment using logical connections to one or more other remote computer(s), such as remote computer 1570, which can in turn have media capabilities different from device 1510. The remote computer 1570 can be a personal computer, a server, a router, a network PC, a peer device, personal digital assistant (PDA), cell phone, handheld computing device, a projection display device, a viewing device, or other common network node, or any other remote media consumption or transmission device, and may include any or all of the elements described above relative to the computer 1510. The logical connections depicted in FIG. 15 can include a network 1571, such local area network (LAN) or a wide area network (WAN), but can also include other networks/buses, either wired or wireless. Such networking environments are commonplace in homes, offices, enterprise-wide computer networks, intranets and the Internet.

When used in a LAN networking environment, the computer 1510 can be connected to the LAN 1571 through a network interface or adapter. When used in a WAN networking environment, the computer 1510 can typically include a communications component, such as a modem, or other means for establishing communications over the WAN, such as the Internet. A communications component, such as wireless communications component, a modem and so on, which can be internal or external, can be connected to the system bus 1521 via the user input interface of input 1540, or other appropriate mechanism. In a networked environment, program modules depicted relative to the computer 1510, or portions thereof, can be stored in a remote memory storage device. It will be appreciated that the network connections shown and described are exemplary and other means of establishing a communications link between the computers can be used.

First Example Networking Environment

Figure 16:
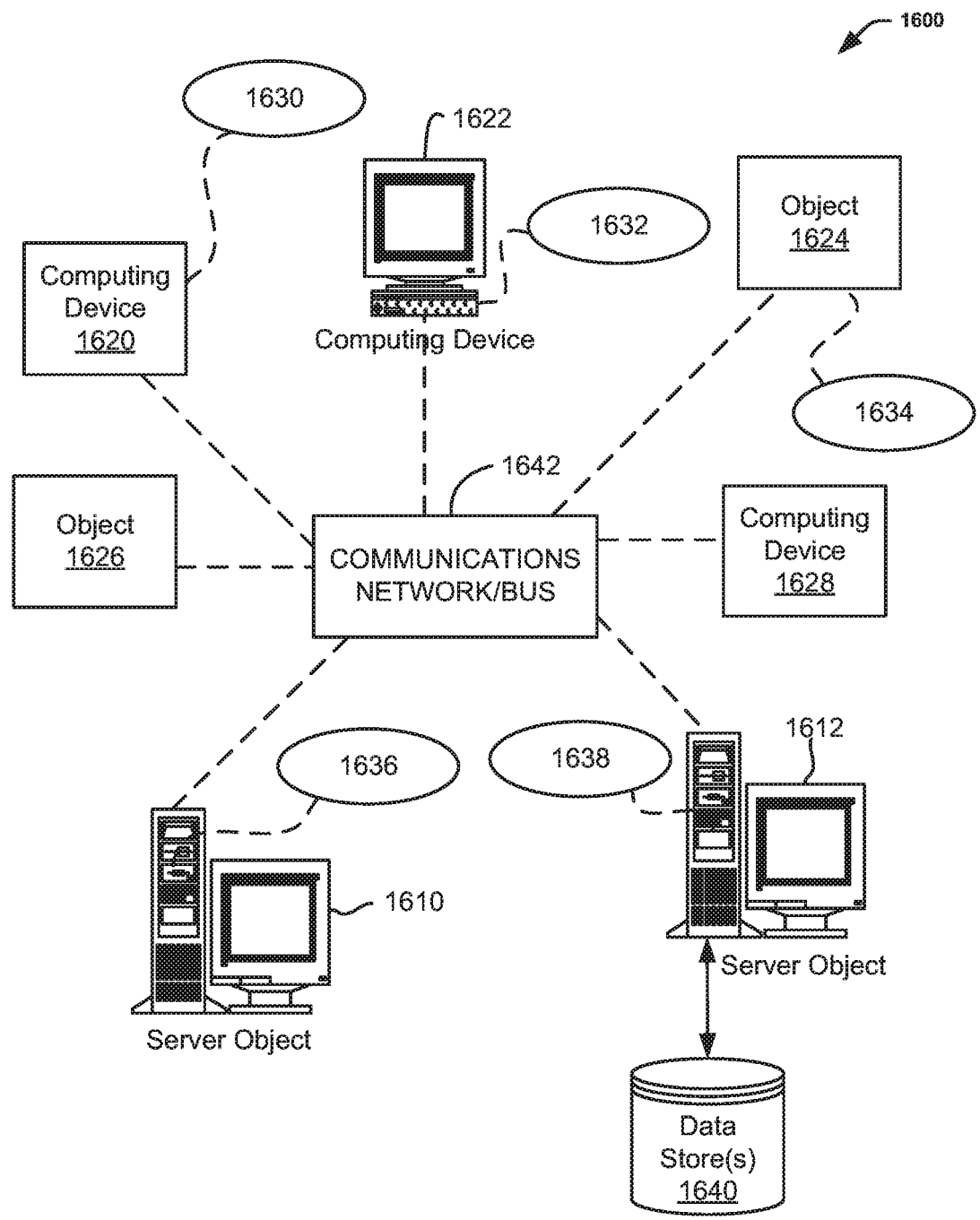
FIG. 16 illustrates a block diagram of an example data communication network that can be operable in conjunction with various aspects described herein.

FIG. 16 provides a schematic diagram of an exemplary networked or distributed computing environment 1600. The distributed computing environment comprises computing objects 1610, 1612, etc. and computing objects or devices 1620, 1622, 1624, 1626, 1628, etc., which may include programs, methods, data stores, programmable logic, etc., as represented by applications 1630, 1632, 1634, 1636, 1638 and data store(s) 1640. It can be appreciated that computing objects 1610, 1612, etc. and computing objects or devices 1620, 1622, 1624, 1626, 1628, etc. may comprise different devices, including a multimedia display device or similar devices depicted within the illustrations, or other devices such as a mobile phone, personal digital assistant (PDA), audio/video device, MP3 players, personal computer, laptop, etc. It should be further appreciated that data store(s) 1640 can include one or more cache memories, one or more registers, or other similar data stores disclosed herein.

Each computing object 1610, 1612, etc. and computing objects or devices 1620, 1622, 1624, 1626, 1628, etc. can communicate with one or more other computing objects 1610, 1612, etc. and computing objects or devices 1620, 1622, 1624, 1626, 1628, etc. by way of the communications network 1642, either directly or indirectly. Even though illustrated as a single element in FIG. 16, communications network 1642 may comprise other computing objects and computing devices that provide services to the system of FIG. 16, and/or may represent multiple interconnected networks, which are not shown. Each computing object 1610, 1612, etc. or computing object or devices 1620, 1622, 1624, 1626, 1628, etc. can also contain an application, such as applications 1630, 1632, 1634, 1636, 1638, that might make use of an API, or other object, software, firmware and/or hardware, suitable for communication with or implementation of the techniques and disclosure described herein.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the systems automatic diagnostic data collection as described in various embodiments herein.

Thus, a host of network topologies and network infrastructures, such as client/server, peer-to-peer, or hybrid architectures, can be utilized. The "client" is a member of a class or group that uses the services of another class or group to which it is not related. A client can be a process, i.e., roughly a set of instructions or tasks, that requests a service provided by another program or process. The client process utilizes the requested service, in some cases without having to "know" any working details about the other program or the service itself.

In a client/server architecture, particularly a networked system, a client is usually a computer that accesses shared network resources provided by another computer, e.g., a server. In the illustration of FIG. 16, as a non-limiting example, computing objects or devices 1620, 1622, 1624, 1626, 1628, etc. can be thought of as clients and computing objects 1610, 1612, etc. can be thought of as servers where computing objects 1610, 1612, etc., acting as servers provide data services, such as receiving data from client computing objects or devices 1620, 1622, 1624, 1626, 1628, etc., storing of data, processing of data, transmitting data to client computing objects or devices 1620, 1622, 1624, 1626, 1628, etc., although any computer can be considered a client, a server, or both, depending on the circumstances.

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to the techniques described herein can be provided standalone, or distributed across multiple computing devices or objects.

In a network environment in which the communications network 1642 or bus is the Internet, for example, the computing objects 1610, 1612, etc. can be Web servers with which other computing objects or devices 1620, 1622, 1624, 1626, 1628, etc. communicate via any of a number of known protocols, such as the hypertext transfer protocol (HTTP). Computing objects 1610, 1612, etc. acting as servers may also serve as clients, e.g., computing objects or devices 1620, 1622, 1624, 1626, 1628, etc., as may be characteristic of a distributed computing environment.

Second Example Networking Environment

Figure 17:
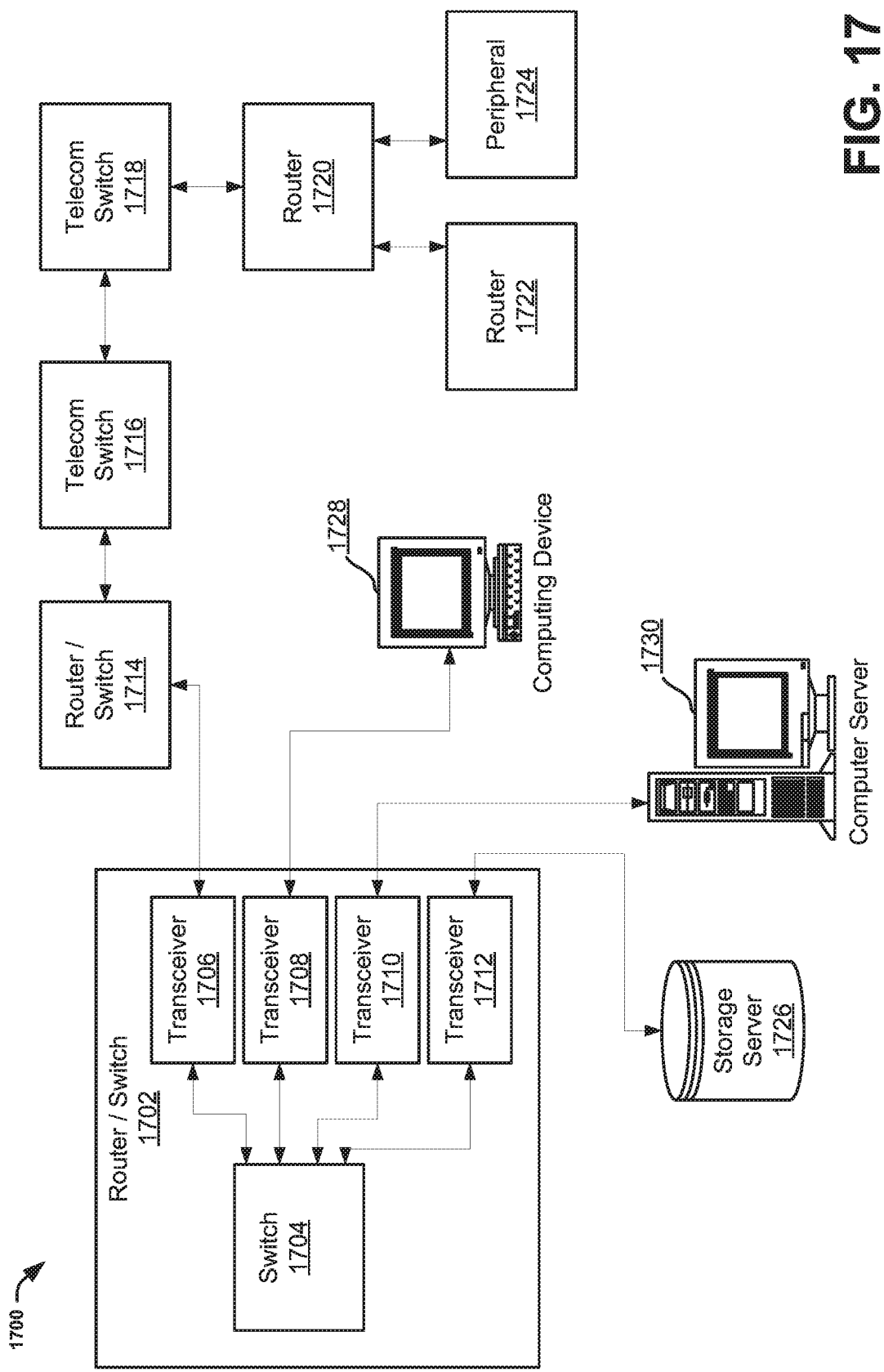
FIG. 17 illustrates a block diagram of an example data communication network that can be operable in conjunction with various aspects described herein.

FIG. 17 provides a schematic diagram of an exemplary networked or distributed computing environment 1700. The distributed computing environment for a non-limiting example, comprises networking objects 1702, 1704, 1706, 1708, 1710, 1712, 1714, 1716, 1718, 1720, 1722, 1724, 1726, 1728, 1730 and may include others. Each of networking objects 1702, 1704, 1706, 1708, 1710, 1712, 1714, 1716, 1718, 1720, 1722, 1724, 1726, 1728, 1730 can also contain an application, that might make use of an API, or other object, software, firmware and/or hardware, suitable for communication with or implementation of the techniques and disclosure described herein. In such an environment, power consumption can be mitigated and saved on a static or continuous basis.

For example, object 1702 can be a router or a switch. Object 1702 can comprise a PCB and may comprise a point-to-point bus. Object 1702 can also comprise switch 1704 and transceivers 1706, 1708, 1710, and 1712, but is not limited to only these components. Object 1702 can also comprise other networked components.

Transceiver 1706 can be communicatively coupled to an object 1714. Object 1714 can be similar to object 1702 or can be a different device. Object 1716 can comprise a telecom switch among other devices. Object 1716 can be a network switch, utilizing ethernet, LAN, or wireless means among others. Object 1718 can be a telecom switch similar to object 1716 or can be a different object.

Objects 1720 and 1722 can comprise routers, switches or other devices. Objects 1720 and 1722 can be the same object as each other or can be different objects.

Object 1724 can be a device communicatively coupled to object 1720 or any component of the networked environment of FIG. 17. For example, object 1724 can comprise a multimedia display device or similar devices depicted within the illustrations, or other devices such as a mobile phone, personal digital assistant (PDA), audio/video device, MP3 players, personal computer, laptop, etc.

It can be appreciated that computing server objects 1726, 1730, etc. may comprise different devices, including a storage server, computer server, multimedia display device or similar devices depicted within the illustrations, or other devices such as a mobile phone, personal digital assistant (PDA), audio/video device, MP3 players, personal computer, laptop, etc.

Object 1726 can be communicatively coupled to object 1712. Object 1712 can comprise a transceiver. Object 1730 can be communicatively coupled to object 1720. Object 1710 can comprise a transceiver.

Object 1728 can comprise a computing device or a different device. Object 1728 may be communicatively coupled to an object 1708. Object 1708 can comprise a transceiver or a different object.

Communication between any object in FIG. 17 can comprise an optical link, optical link, optical fiber, electrical copper cable, or printed PCB among others. Such interfaces between objects 1702, 1704, 1706, 1708, 1710, 1712, 1714, 1716, 1718, 1720, 1722, 1724, 1726, 1728, 1730, etc. might include as serial link between two objects on the same PCB, two or more PCBs connected by a connector (e.g. daughter card), two or more PCBs connected by a backplane, an electrical cable between objects, an optical fiber between objects, etc.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the systems automatic diagnostic data collection as described in various embodiments herein.

Thus, a host of network topologies and network infrastructures, such as client/server, peer-to-peer, or hybrid architectures, can be utilized. The "client" is a member of a class or group that uses the services of another class or group to which it is not related. A client can be a process, i.e., roughly a set of instructions or tasks, that requests a service provided by another program or process. The client process utilizes the requested service, in some cases without having to "know" any working details about the other program or the service itself.

In a client/server architecture, particularly a networked system, a client is usually a computer that accesses shared network resources provided by another computer, e.g., a server. In the illustration of FIG. 17, as a non-limiting example, computing objects or devices 1726, 1730, etc. can be thought of as servers where computing objects 1726, 1730, etc., acting as servers provide data services, such as receiving data from client computing objects or devices 1724, 1728, etc., storing of data, processing of data, transmitting data to client computing objects or devices 1724, 1728, etc., although any computer can be considered a client, a server, or both, depending on the circumstances.

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to the techniques described herein can be provided standalone, or distributed across multiple computing devices or objects.

In a network environment in which the communications network 1642 or bus is the Internet, for example, the computing objects 1726, 1730, etc. can be Web servers with which other computing objects or devices 1724, 1728, etc. communicate via any of a number of known protocols, such as the hypertext transfer protocol (HTTP). Computing objects 1726, 1730, etc. acting as servers may also serve as clients, e.g., computing objects or devices 1724, 1738 etc., as may be characteristic of a distributed computing environment.

Reference throughout this specification to "one embodiment," "an embodiment," "an example", "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one example," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "architecture," "engine" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the disclosed subject matter. It is, of course, not possible to describe every conceivable combination of components or methods for purposes of describing the disclosed subject matter, but one of ordinary skill in the art can recognize that many further combinations and permutations of the disclosed subject matter are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A system for transferring phase information, comprising:

a digital phase-locked loop component configured to receive input phase information from a clock recovery component that is associated with a first phase interpolator, generate output phase information based at least in part on the input phase information and a filter of the digital phase-locked loop component that is applied to the input phase information, and transmit the output phase information to a second phase interpolator, wherein the digital phase-locked loop component is configured to control the filter based at least in part on a parameter that facilitates defining a filter function of the filter; and
a generator component configured to generate a phase modification request based at least in part on a frequency offset generated by the filter, wherein the output phase information comprises the phase modification request.

2. The system of claim 1, wherein the digital phase-locked loop component is configured to comprise first characteristics that emulate second characteristics of an analog phase-locked loop.

3. The system of claim 1, wherein the phase modification request is an increment request to increment a phase value, a decrement request to decrement the phase value, or a no change request to maintain the phase value, wherein the output phase information comprises the increment request, the decrement request, or the no change request that is transmitted to the second phase interpolator to facilitate generation of a clock or transmitted to at least one other phase interpolator to facilitate generation of at least one other clock, wherein the second phase interpolator is associated with a transmitter of a device, and wherein the at least one other phase interpolator is associated with at least one other component of the device.

4. The system of claim 1, wherein the input phase information comprises an input increment request, an input decrement request, or an input no change request received by the digital phase-locked loop component from the clock recovery component of a receiver component, and wherein the first phase interpolator also receives the input phase information from the clock recovery component.

5. The system of claim 1, wherein the filter is configured to comprise a proportional and integral filter component configured to filter the input phase information to reduce phase noise or an amount of jitter in the input phase information.

6. The system of claim 5, wherein the digital phase-locked loop component is further configured to be tuned to have a defined damping factor and to have the filter have a defined filter response based at least in part on a set of parameters, and wherein the set of parameters comprises a first parameter utilized to set a bandwidth of a closed-loop response of the digital phase-locked loop component and a second parameter utilized to set the damping factor of the closed-loop response.

7. The system of claim 6, wherein the defined filter response is a low-pass filtering response having a defined frequency range.

8. The system of claim 1, wherein the filter is further configured to comprise a proportional gain path configured to have a first gain level and an integral gain path configured to have a second gain level, wherein the proportional gain path applies the first gain level and sets a bandwidth of a closed-loop response of the digital phase-locked loop component based at least in part on a first parameter, wherein the integral gain path is utilized as an integrator to add an input value to an accumulated value, wherein the second gain level of the integral gain path sets a damping factor of the closed-loop response and is determined based at least in part on a second parameter, wherein the input value is determined based at least in part on the second gain level, and wherein the accumulated value comprises previous input values input to an accumulator component of the integrator.

9. The system of claim 1, wherein the digital phase-locked loop component comprises a feedback path from an output of the generator component to an input of an accumulator component, wherein the output phase information is transmitted via the feedback path, wherein the output phase information is scaled using fractional scaling by removing or adding increments or decrements of the output phase information to upscale or downscale the output phase information.

10. The system of claim 1, wherein the digital phase-locked loop component comprises a feedback path from an output of the generator component to an accumulator component of the filter, wherein the output phase information is transmitted via the feedback path, wherein the input phase information input to the accumulator component is scaled using a first scale or the output phase information input to the accumulator component is scaled using a second scale.

11. The system of claim 10, wherein scaling of the input phase information input to the accumulator component using the first scale or the output phase information input to the accumulator component using the second scale comprises fractional scaling.

12. The system of claim 1, wherein the digital phase-locked loop component comprises an accumulator component that accumulates respective input phase information, including the input phase information, received from the first phase interpolator and respective output phase information, including the output phase information, received from a feedback path of the digital phase-locked loop component, wherein the accumulator component determines a phase difference based at least in part on a difference between the respective input phase information and the respective output phase information.

13. The system of claim 1, wherein the digital phase-locked loop component is further configured to detect the frequency offset being outside of a defined threshold frequency offset range.

14. The system of claim 1, wherein the digital phase-locked loop component is further configured to determine and generate the output phase information based at least in part on historical input phase information received from the clock recovery component over a defined period of time and the input phase information, and wherein the historical input phase information comprises at least one previous input phase information received prior to the input phase information.

15. A method, comprising:
controlling, by a digital phase-locked loop, a filter based at least in part on a parameter that facilitates determining a filter function of the filter;
generating, by the digital phase-locked loop, output phase data based at least in part on the filter that is applied to input phase data received from a clock recovery circuit that is associated with a first phase interpolator; and
transmitting, by the digital phase-locked loop, the output phase data to a second phase interpolator to facilitate generating clock data of a clock to be applied to a transmitter or other component of a device, wherein the output phase data comprises a phase modification request determined based at least in part on a frequency offset produced by the filter.

16. The method of claim 15, further comprising:
receiving, by the digital phase-locked loop, the input phase data from the clock recovery circuit of a receiver, wherein the input phase data comprises an input increment request, an input decrement request, or an input no change request, wherein the first phase interpolator also receives the input phase data from the clock recovery circuit, wherein the phase modification request comprises an increment request to increment a phase value, a decrement request to decrement the phase value, or a no change request to maintain the phase value, and wherein the transmitting the output phase data comprises transmitting the increment request, the decrement request, or the no change request to the second phase interpolator to facilitate generating the clock data of the clock.

17. The method of claim 15, further comprising:

to facilitate filtering of the input phase data:

applying a first gain level to a proportional path of the filter;

configuring a bandwidth of a closed-loop response of the filter based at least in part on a first parameter;

applying a second gain level to an integral path of the filter;

configuring a damping factor of the closed-loop response of the filter based at least in part on a second parameter; and based at least in part on the bandwidth and the damping factor, filtering, via the filter, the input phase data to reduce phase noise or an amount of jitter of the input phase data.

18. The method of claim 15, further comprising:

forming a feedback path between an output of the filter and an input of an accumulator of the filter;

transmitting the output phase data via the feedback path;

scaling, using fractional scaling, the output phase data to upscale or downscale the output phase data to generate scaled output phase data;

accumulating, by the accumulator, the scaled output phase data and previous scaled output phase data;

accumulating, by the accumulator, the input phase data and previous input phase data; and determining, by the accumulator, a difference in accumulated phase based at least in part on the input phase data, the previous input phase data, the scaled output phase data, and the previous scaled output phase data.

19. A device, comprising:

a digital phase-locked loop component configured to receive an input phase signal from a clock and data recovery unit that is associated with a first phase interpolator, generate an output phase signal based at least in part on a filter of the digital phase-locked loop component that is applied to accumulated input phase signals, and transmit the output phase signal to a second phase interpolator, wherein the digital phase-locked loop component is configured to control the filter based at least in part on a parameter that facilitates defining a filter function of the filter, and wherein inputs to the filter comprise the accumulated input phase signals that are based at least in part on an accumulation of input phase signals, including the input phase signal, from the first phase interpolator and an accumulation of output phase signals, including the output phase signal, received from a feedback path of the digital phase-locked loop component; and a generator component configured to generate a phase modification request based at least in part on a frequency offset signal produced by the filter, wherein the output phase signal comprises the phase modification request.

20. The device of claim 19, wherein the second phase interpolator is configured to generate a clock signal based at least in part on the output phase signal received from the clock and data recovery unit, and wherein the clock signal is configured to be applied to a transmitter component or another component of the device.

\* \* \* \* \*